US009762830B2

(12) United States Patent
Jiang et al.

(10) Patent No.: US 9,762,830 B2
(45) Date of Patent: Sep. 12, 2017

(54) HIGH DYNAMIC RANGE CMOS IMAGE SENSOR HAVING ANTI-BLOOMING PROPERTIES AND ASSOCIATED METHODS

(71) Applicant: SiOnyx, LLC, Beverly, MA (US)

(72) Inventors: Jutao Jiang, Tigard, OR (US); Matt Borg, Albany, OR (US)

(73) Assignee: SiOnyx, LLC, Beverly, MA (US)

( * ) Notice: Subject to any disclaimer, the term of this patent is extended or adjusted under 35 U.S.C. 154(b) by 0 days.

(21) Appl. No.: 14/183,338

(22) Filed: Feb. 18, 2014

(65) Prior Publication Data

US 2014/0313386 A1    Oct. 23, 2014

Related U.S. Application Data

(60) Provisional application No. 61/765,599, filed on Feb. 15, 2013.

(51) Int. Cl.
*H04N 5/225*    (2006.01)
*H04N 5/374*    (2011.01)
(Continued)

(52) U.S. Cl.
CPC ....... *H04N 5/374* (2013.01); *H01L 27/14654* (2013.01); *H04N 5/3591* (2013.01); *H04N 5/35581* (2013.01)

(58) Field of Classification Search
CPC ... H04N 3/1556; H04N 3/1568; H04N 5/2175
See application file for complete search history.

(56) References Cited

U.S. PATENT DOCUMENTS 3,487,223 A    12/1969    St. John
3,922,571 A    11/1975    Smith
(Continued)

FOREIGN PATENT DOCUMENTS

AU    3666484    6/1985
CN    101404307    4/2009
(Continued)

OTHER PUBLICATIONS

International Search Report and Written Opinion, mailed Aug. 11, 2014, in corresponding PCT/US2014/016979,(11 pages).
(Continued)

*Primary Examiner* — Twyler Haskins
*Assistant Examiner* — Dwight C Tejano
(74) *Attorney, Agent, or Firm* — Thomas Engellenner; Reza Mollaaghababa; Pepper Hamilton LLP

(57) ABSTRACT

A method of providing blooming protection to a CMOS imager having a pixel array of a plurality of pixels arranged in rows and columns, where the CMOS imager is operable to capture high dynamic range images using a rolling shutter, is provided. Such a method can include reading out charge accumulated by the pixels in a readout row of a first integration time, applying a reset to the readout row for a reset time sufficient to allow readout and reset to occur in at least one subsequent row, and starting a second integration time of the pixels in the readout row, wherein the second integration time is shorter than the first integration time, and wherein the at least one subsequent row is a sufficient number of rows to have a combined reset to preclude blooming effects from the pixel array during the second integration time.

23 Claims, 6 Drawing Sheets

(51) Int. Cl.
*H01L 27/146* (2006.01)
*H04N 5/355* (2011.01)
*H04N 5/359* (2011.01)

(56) References Cited

U.S. PATENT DOCUMENTS

| | | | |
|---|---|---|---|
| 3,973,994 A | 8/1976 | Redfield |
| 3,994,012 A | 11/1976 | Warner, Jr. |
| 4,017,887 A | 4/1977 | Davies et al. |
| 4,149,174 A | 4/1979 | Shannon |
| 4,176,365 A | 11/1979 | Kroger |
| 4,201,450 A | 5/1980 | Trapani |
| 4,242,149 A | 12/1980 | King et al. |
| 4,253,882 A | 3/1981 | Dalal |
| 4,277,793 A | 7/1981 | Webb |
| 4,322,571 A | 3/1982 | Stanbery |
| 4,419,533 A | 12/1983 | Czubatyj et al. |
| 4,452,826 A | 6/1984 | Shields et al. |
| 4,493,942 A | 1/1985 | Sheng et al. |
| 4,514,582 A | 4/1985 | Tiedje et al. |
| 4,536,608 A | 8/1985 | Sheng et al. |
| 4,568,960 A | 2/1986 | Petroff et al. |
| 4,593,303 A | 6/1986 | Dyck et al. |
| 4,593,313 A | 6/1986 | Nagasaki |
| 4,617,593 A | 10/1986 | Dudley |
| 4,630,082 A | 12/1986 | Sakai |
| 4,648,936 A | 3/1987 | Ashby et al. |
| 4,663,188 A | 5/1987 | Kane |
| 4,672,206 A | 6/1987 | Suzuki |
| 4,673,770 A | 6/1987 | Mandelkorn |
| 4,679,068 A | 7/1987 | Lillquist et al. |
| 4,751,571 A | 6/1988 | Lillquist |
| 4,775,425 A | 10/1988 | Guha et al. |
| 4,777,490 A | 10/1988 | Sharma et al. |
| 4,829,013 A | 5/1989 | Yamazaki |
| 4,883,962 A | 11/1989 | Elliott |
| 4,886,958 A | 12/1989 | Merryman |
| 4,887,255 A | 12/1989 | Handa et al. |
| 4,894,526 A | 1/1990 | Bethea et al. |
| 4,910,568 A | 3/1990 | Takei et al. |
| 4,910,588 A | 3/1990 | Kinoshita et al. |
| 4,964,134 A | 10/1990 | Westbrook et al. |
| 4,965,784 A | 10/1990 | Land et al. |
| 4,968,372 A | 11/1990 | Maass |
| 4,999,308 A | 3/1991 | Nishiura et al. |
| 5,021,100 A | 6/1991 | Ishihara et al. |
| 5,021,854 A | 6/1991 | Huth |
| 5,080,725 A | 1/1992 | Green et al. |
| 5,081,049 A | 1/1992 | Green et al. |
| 5,100,478 A | 3/1992 | Kawabata |
| 5,101,260 A | 3/1992 | Nath |
| 5,114,876 A | 5/1992 | Weiner |
| 5,127,964 A | 7/1992 | Hamakawa et al. |
| 5,164,324 A | 11/1992 | Russell et al. |
| 5,208,822 A | 5/1993 | Haus et al. |
| 5,223,043 A | 6/1993 | Olson et al. |
| 5,234,790 A | 8/1993 | Lang et al. |
| 5,244,817 A | 9/1993 | Hawkins et al. |
| 5,296,045 A | 3/1994 | Banerjee et al. |
| 5,309,275 A | 5/1994 | Nishimura et al. |
| 5,322,988 A | 6/1994 | Russell et al. |
| 5,346,850 A | 9/1994 | Kaschmitter et al. |
| 5,351,446 A | 10/1994 | Langsdorf |
| 5,370,747 A | 12/1994 | Noguchi et al. |
| 5,373,182 A | 12/1994 | Norton |
| 5,381,431 A | 1/1995 | Zayhowski |
| 5,383,217 A | 1/1995 | Uemura |
| 5,390,201 A | 2/1995 | Tomono et al. |
| 5,413,100 A | 5/1995 | Barthelemy et al. |
| 5,449,626 A | 9/1995 | Hezel |
| 5,454,347 A | 10/1995 | Shibata et al. |
| 5,502,329 A | 3/1996 | Pezzani |
| 5,523,570 A | 6/1996 | Hairston |
| 5,559,361 A | 9/1996 | Pezzani |
| 5,569,615 A | 10/1996 | Yamazaki et al. |
| 5,578,858 A | 11/1996 | Mueller et al. |
| 5,580,615 A | 12/1996 | Itoh et al. |
| 5,589,008 A | 12/1996 | Kepper |
| 5,589,704 A | 12/1996 | Levine |
| 5,597,621 A | 1/1997 | Hummel et al. |
| 5,600,130 A | 2/1997 | VanZeghbroeck |
| 5,626,687 A | 5/1997 | Campbell |
| 5,627,081 A | 5/1997 | Tsuo et al. |
| 5,635,089 A | 6/1997 | Singh et al. |
| 5,640,013 A | 6/1997 | Ishikawa et al. |
| 5,641,362 A | 6/1997 | Meier |
| 5,641,969 A | 6/1997 | Cooke et al. |
| 5,705,413 A | 1/1998 | Harkin et al. |
| 5,705,828 A | 1/1998 | Noguchi et al. |
| 5,708,486 A | 1/1998 | Miyawaki et al. |
| 5,710,442 A | 1/1998 | Watanabe et al. |
| 5,714,404 A | 2/1998 | Mititsky et al. |
| 5,727,096 A | 3/1998 | Ghirardi et al. |
| 5,731,213 A | 3/1998 | Ono |
| 5,751,005 A | 5/1998 | Wyles et al. |
| 5,758,644 A | 6/1998 | Diab et al. |
| 5,766,127 A | 6/1998 | Pologe et al. |
| 5,766,964 A | 6/1998 | Rohatgi et al. |
| 5,773,820 A | 6/1998 | Osajda et al. |
| 5,779,631 A | 7/1998 | Chance |
| 5,781,392 A | 7/1998 | Clark |
| 5,792,280 A | 8/1998 | Ruby et al. |
| 5,808,350 A | 9/1998 | Jack et al. |
| 5,859,446 A | 1/1999 | Nagasu et al. |
| 5,861,639 A | 1/1999 | Bernier |
| 5,923,071 A | 7/1999 | Saito |
| 5,935,320 A | 8/1999 | Graef et al. |
| 5,942,789 A | 8/1999 | Morikawa |
| 5,943,584 A | 8/1999 | Shim et al. |
| 5,963,790 A | 10/1999 | Matsuno et al. |
| 5,977,603 A | 11/1999 | Ishikawa |
| 6,071,796 A | 6/2000 | Voutsas |
| 6,072,117 A | 6/2000 | Matsuyama et al. |
| 6,080,988 A | 6/2000 | Ishizuya et al. |
| 6,082,858 A | 7/2000 | Grace et al. |
| 6,097,031 A | 8/2000 | Cole |
| 6,106,689 A | 8/2000 | Matsuyama |
| 6,107,618 A | 8/2000 | Fossum et al. |
| 6,111,300 A | 8/2000 | Cao et al. |
| 6,147,297 A | 11/2000 | Wettling et al. |
| 6,160,833 A | 12/2000 | Floyd et al. |
| 6,168,965 B1 | 1/2001 | Malinovich et al. |
| 6,194,722 B1 | 2/2001 | Fiorini et al. |
| 6,204,506 B1 | 3/2001 | Akahori et al. |
| 6,229,192 B1 | 5/2001 | Gu |
| 6,252,256 B1 | 6/2001 | Ugge et al. |
| 6,290,713 B1 | 9/2001 | Russell |
| 6,291,302 B1 | 9/2001 | Yu |
| 6,313,901 B1 | 11/2001 | Cacharelis |
| 6,320,296 B1 | 11/2001 | Fujii et al. |
| 6,327,022 B1 | 12/2001 | Nishi |
| 6,331,445 B1 | 12/2001 | Janz et al. |
| 6,331,885 B1 | 12/2001 | Nishi |
| 6,340,281 B1 | 1/2002 | Haraguchi |
| 6,372,591 B1 | 4/2002 | Mineji et al. |
| 6,372,611 B1 | 4/2002 | Horikawa |
| 6,379,979 B1 | 4/2002 | Connolly |
| 6,420,706 B1 | 7/2002 | Lurie et al. |
| 6,429,036 B1 | 8/2002 | Nixon et al. |
| 6,429,037 B1 | 8/2002 | Wenham et al. |
| 6,465,860 B2 | 10/2002 | Shigenaka et al. |
| 6,475,839 B2 | 11/2002 | Zhang et al. |
| 6,483,116 B1 | 11/2002 | Kozlowski et al. |
| 6,483,929 B1 | 11/2002 | Murakami et al. |
| 6,486,522 B1 | 11/2002 | Bishay et al. |
| 6,493,567 B1 | 12/2002 | Krivitski et al. |
| 6,498,336 B1 | 12/2002 | Tian et al. |
| 6,500,690 B1 | 12/2002 | Yamagishi et al. |
| 6,504,178 B2 | 1/2003 | Carlson et al. |
| 6,580,053 B1 | 6/2003 | Voutsas |
| 6,583,936 B1 | 6/2003 | Kaminsky et al. |
| 6,597,025 B2 | 7/2003 | Lauter et al. |
| 6,607,927 B2 | 8/2003 | Ramappa et al. |
| 6,624,049 B1 | 9/2003 | Yamazaki |

(56) References Cited

U.S. PATENT DOCUMENTS

| | | | |
|---|---|---|---|
| 6,639,253 B2 | 10/2003 | Duane et al. |
| 6,667,528 B2 | 12/2003 | Cohen et al. |
| 6,677,655 B2 | 1/2004 | Fitzergald |
| 6,677,656 B2 | 1/2004 | François |
| 6,683,326 B2 | 1/2004 | Iguchi et al. |
| 6,689,209 B2 | 2/2004 | Falster et al. |
| 6,753,585 B1 | 6/2004 | Kindt |
| 6,759,262 B2 | 7/2004 | Theil et al. |
| 6,790,701 B2 | 9/2004 | Shigenaka et al. |
| 6,800,541 B2 | 10/2004 | Okumura |
| 6,801,799 B2 | 10/2004 | Mendelson |
| 6,803,555 B1 | 10/2004 | Parrish et al. |
| 6,815,685 B2 | 11/2004 | Wany |
| 6,818,535 B2 | 11/2004 | Lu et al. |
| 6,822,313 B2 | 11/2004 | Matsushita |
| 6,825,057 B1 | 11/2004 | Heyers et al. |
| 6,864,156 B1 | 3/2005 | Conn |
| 6,864,190 B2 | 3/2005 | Han et al. |
| 6,867,806 B1 | 3/2005 | Lee et al. |
| 6,900,839 B1 | 5/2005 | Kozlowski et al. |
| 6,907,135 B2 | 6/2005 | Gifford |
| 6,911,375 B2 | 6/2005 | Guarini et al. |
| 6,919,587 B2 | 7/2005 | Ballon et al. |
| 6,923,625 B2 | 8/2005 | Sparks |
| 6,927,432 B2 | 8/2005 | Holm et al. |
| 6,984,816 B2 | 1/2006 | Holm et al. |
| 7,008,854 B2 | 3/2006 | Forbes |
| 7,041,525 B2 | 5/2006 | Clevenger et al. |
| 7,057,256 B2 | 6/2006 | Carey, III et al. |
| 7,075,079 B2 | 7/2006 | Wood |
| 7,091,411 B2 | 8/2006 | Falk et al. |
| 7,109,517 B2 | 9/2006 | Zaidi |
| 7,126,212 B2 | 10/2006 | Enquist et al. |
| 7,132,724 B1 | 11/2006 | Merrill |
| 7,202,102 B2 | 4/2007 | Yao |
| 7,211,501 B2 | 5/2007 | Liu et al. |
| 7,235,812 B2 | 6/2007 | Chu et al. |
| 7,247,527 B2 | 7/2007 | Shimomura et al. |
| 7,247,812 B2 | 7/2007 | Tsao |
| 7,256,102 B2 | 8/2007 | Nakata et al. |
| 7,271,445 B2 | 9/2007 | Forbes |
| 7,271,835 B2 | 9/2007 | Iizuka et al. |
| 7,285,482 B2 | 10/2007 | Ochi |
| 7,314,832 B2 | 1/2008 | Kountz et al. |
| 7,354,792 B2 | 4/2008 | Carey, III et al. |
| 7,358,498 B2 | 4/2008 | Geng et al. |
| 7,375,378 B2 | 5/2008 | Manivannan et al. |
| 7,390,689 B2 | 6/2008 | Mazur et al. |
| 7,432,148 B2 | 10/2008 | Li et al. |
| 7,442,629 B2 | 10/2008 | Mazur et al. |
| 7,446,359 B2 | 11/2008 | Lee et al. |
| 7,446,807 B2 | 11/2008 | Hong |
| 7,456,452 B2 | 11/2008 | Wells et al. |
| 7,482,532 B2 | 1/2009 | Yi et al. |
| 7,498,650 B2 | 3/2009 | Lauxtermann |
| 7,504,325 B2 | 3/2009 | Koezuka et al. |
| 7,504,702 B2 | 3/2009 | Mazur et al. |
| 7,511,750 B2 | 3/2009 | Murakami |
| 7,521,737 B2 | 4/2009 | Augusto |
| 7,528,463 B2 | 5/2009 | Forbes |
| 7,542,085 B2 | 6/2009 | Altice, Jr. et al. |
| 7,547,616 B2 | 6/2009 | Fogel et al. |
| 7,551,059 B2 | 6/2009 | Farrier |
| 7,560,750 B2 | 7/2009 | Niira et al. |
| 7,564,631 B2 | 7/2009 | Li et al. |
| 7,582,515 B2 | 9/2009 | Choi et al. |
| 7,592,593 B2 | 9/2009 | Kauffman et al. |
| 7,595,213 B2 | 9/2009 | Kwon et al. |
| 7,605,397 B2 | 10/2009 | Kindem et al. |
| 7,615,808 B2 | 11/2009 | Pain et al. |
| 7,618,839 B2 | 11/2009 | Rhodes |
| 7,619,269 B2 | 11/2009 | Ohkawa |
| 7,629,582 B2 | 12/2009 | Hoffman et al. |
| 7,648,851 B2 | 1/2010 | Fu et al. |
| 7,649,156 B2 | 1/2010 | Lee |
| 7,705,879 B2 | 4/2010 | Kerr et al. |
| 7,731,665 B2 | 6/2010 | Lee et al. |
| 7,741,666 B2 | 6/2010 | Nozaki et al. |
| 7,745,901 B1 | 6/2010 | McCaffrey et al. |
| 7,763,913 B2 | 7/2010 | Fan et al. |
| 7,772,028 B2 | 8/2010 | Adkisson et al. |
| 7,781,856 B2 | 8/2010 | Mazur et al. |
| 7,800,192 B2 | 9/2010 | Venezia et al. |
| 7,800,684 B2 | 9/2010 | Tatani |
| 7,816,220 B2 | 10/2010 | Mazur et al. |
| 7,828,983 B2 | 11/2010 | Weber et al. |
| 7,847,253 B2 | 12/2010 | Carey et al. |
| 7,847,326 B2 | 12/2010 | Park et al. |
| 7,855,406 B2 | 12/2010 | Yamaguchi et al. |
| 7,875,498 B2 | 1/2011 | Elbanhawy et al. |
| 7,880,168 B2 | 2/2011 | Lenchenkov |
| 7,884,439 B2 | 2/2011 | Mazur et al. |
| 7,884,446 B2 | 2/2011 | Mazur et al. |
| 7,897,942 B1 | 3/2011 | Bareket |
| 7,910,964 B2 | 3/2011 | Kawahito et al. |
| 7,923,801 B2 | 4/2011 | Tian et al. |
| 7,968,834 B2 | 6/2011 | Veeder |
| 8,008,205 B2 | 8/2011 | Fukushima et al. |
| 8,013,411 B2 | 9/2011 | Cole |
| 8,030,726 B2 | 10/2011 | Sumi |
| 8,035,343 B2 | 10/2011 | Seman, Jr. |
| 8,058,615 B2 | 11/2011 | McCaffrey |
| 8,080,467 B2 | 12/2011 | Carey et al. |
| 8,088,219 B2 | 1/2012 | Knerer et al. |
| 8,093,559 B1 | 1/2012 | Rajavel |
| RE43,169 E | 2/2012 | Parker |
| 8,164,126 B2 | 4/2012 | Moon et al. |
| 8,207,051 B2 | 6/2012 | Sickler et al. |
| 8,247,259 B2 | 8/2012 | Grolier et al. |
| 8,259,293 B2 | 9/2012 | Andreou et al. |
| 8,288,702 B2 | 10/2012 | Veeder |
| 8,470,619 B2 | 6/2013 | Bour |
| 8,476,681 B2 | 7/2013 | Haddad et al. |
| 8,564,087 B2 | 10/2013 | Yamamura et al. |
| 8,603,902 B2 | 12/2013 | Mazur et al. |
| 8,629,485 B2 | 1/2014 | Yamamura et al. |
| 8,680,591 B2 | 3/2014 | Haddad et al. |
| 8,742,528 B2 | 6/2014 | Yamamura et al. |
| 8,884,226 B2 | 11/2014 | Miyazaki et al. |
| 8,906,670 B2 | 12/2014 | Gray |
| 8,916,945 B2 | 12/2014 | Sakamoto et al. |
| 8,994,135 B2 | 3/2015 | Yamamura et al. |
| 9,184,204 B2 | 11/2015 | Hu |
| 9,190,551 B2 | 11/2015 | Yamamura et al. |
| 9,209,345 B2 | 12/2015 | Haddad |
| 9,369,641 B2 | 6/2016 | Hu |
| 2001/0017344 A1 | 8/2001 | Aebi |
| 2001/0022768 A1 | 9/2001 | Takahashi |
| 2001/0044175 A1 | 11/2001 | Barrett et al. |
| 2001/0044266 A1 | 11/2001 | Katsuoka |
| 2002/0020893 A1 | 2/2002 | Lhorte |
| 2002/0024618 A1 | 2/2002 | Imai |
| 2002/0056845 A1 | 5/2002 | Iguchi et al. |
| 2002/0060322 A1 | 5/2002 | Tanabe et al. |
| 2002/0079290 A1 | 6/2002 | Holdermann |
| 2002/0117699 A1 | 8/2002 | Francois |
| 2002/0148964 A1 | 10/2002 | Dausch et al. |
| 2002/0182769 A1 | 12/2002 | Campbell |
| 2003/0029495 A1 | 2/2003 | Mazur et al. |
| 2003/0030083 A1 | 2/2003 | Lee et al. |
| 2003/0045092 A1 | 3/2003 | Shin |
| 2003/0057357 A1 | 3/2003 | Uppal et al. |
| 2003/0111106 A1 | 6/2003 | Nagano et al. |
| 2003/0210332 A1 | 11/2003 | Frame |
| 2003/0213515 A1 | 11/2003 | Sano et al. |
| 2003/0214595 A1 | 11/2003 | Mabuchi |
| 2003/0228883 A1 | 12/2003 | Kusakari et al. |
| 2004/0014307 A1 | 1/2004 | Shin et al. |
| 2004/0016886 A1 | 1/2004 | Ringermacher et al. |
| 2004/0041168 A1 | 3/2004 | Hembree et al. |
| 2004/0046224 A1 | 3/2004 | Rossel et al. |
| 2004/0077117 A1 | 4/2004 | Ding et al. |
| 2004/0080638 A1 | 4/2004 | Lee |
| 2004/0130020 A1 | 7/2004 | Kuwabara et al. |

(56) References Cited

U.S. PATENT DOCUMENTS

| | | |
|---|---|---|
| 2004/0161868 A1 | 8/2004 | Hong |
| 2004/0222187 A1 | 11/2004 | Lin |
| 2004/0252931 A1 | 12/2004 | Belleville et al. |
| 2005/0051822 A1 | 3/2005 | Manning |
| 2005/0062041 A1 | 3/2005 | Terakawa et al. |
| 2005/0088634 A1 | 4/2005 | Kosugi |
| 2005/0093100 A1 | 5/2005 | Chen et al. |
| 2005/0101100 A1 | 5/2005 | Kretchmer et al. |
| 2005/0101160 A1 | 5/2005 | Garg et al. |
| 2005/0127401 A1 | 6/2005 | Mazur et al. |
| 2005/0134698 A1 | 6/2005 | Schroeder et al. |
| 2005/0150542 A1 | 7/2005 | Madan |
| 2005/0158969 A1 | 7/2005 | Binns et al. |
| 2005/0211996 A1 | 9/2005 | Krishna et al. |
| 2005/0227390 A1 | 10/2005 | Shtein et al. |
| 2006/0006482 A1 | 1/2006 | Rieve et al. |
| 2006/0011954 A1 | 1/2006 | Ueda et al. |
| 2006/0011955 A1 | 1/2006 | Baggenstoss |
| 2006/0060848 A1 | 3/2006 | Chang et al. |
| 2006/0071254 A1 | 4/2006 | Rhodes |
| 2006/0079062 A1 | 4/2006 | Mazur et al. |
| 2006/0086956 A1 | 4/2006 | Furukawa et al. |
| 2006/0097172 A1 | 5/2006 | Park |
| 2006/0118781 A1 | 6/2006 | Rhodes |
| 2006/0121680 A1 | 6/2006 | Tanaka |
| 2006/0128087 A1 | 6/2006 | Bamji et al. |
| 2006/0132633 A1 | 6/2006 | Nam et al. |
| 2006/0138396 A1 | 6/2006 | Lin et al. |
| 2006/0145148 A1 | 7/2006 | Hirai et al. |
| 2006/0145176 A1 | 7/2006 | Lee |
| 2006/0160343 A1 | 7/2006 | Chong et al. |
| 2006/0166475 A1 | 7/2006 | Mantl |
| 2006/0175529 A1 | 8/2006 | Harmon et al. |
| 2006/0180885 A1 | 8/2006 | Rhodes |
| 2006/0181627 A1 | 8/2006 | Farrier |
| 2006/0210122 A1 | 9/2006 | Cleveland |
| 2006/0214121 A1 | 9/2006 | Schrey et al. |
| 2006/0228897 A1 | 10/2006 | Timans |
| 2006/0231914 A1 | 10/2006 | Carey et al. |
| 2006/0238632 A1 | 10/2006 | Shah |
| 2006/0244090 A1 | 11/2006 | Roy et al. |
| 2006/0255340 A1 | 11/2006 | Manivannan et al. |
| 2006/0257140 A1 | 11/2006 | Seger |
| 2007/0035849 A1 | 2/2007 | Li et al. |
| 2007/0035879 A1 | 2/2007 | Hall et al. |
| 2007/0051876 A1 | 3/2007 | Sumi et al. |
| 2007/0052050 A1 | 3/2007 | Dierickx |
| 2007/0076481 A1 | 4/2007 | Tennant |
| 2007/0115554 A1 | 5/2007 | Breitung et al. |
| 2007/0123005 A1 | 5/2007 | Hiura et al. |
| 2007/0138590 A1 | 6/2007 | Wells et al. |
| 2007/0145505 A1 | 6/2007 | Kim et al. |
| 2007/0178672 A1 | 8/2007 | Tanaka et al. |
| 2007/0187670 A1 | 8/2007 | Hsu et al. |
| 2007/0189583 A1 | 8/2007 | Shimada et al. |
| 2007/0194356 A1 | 8/2007 | Moon et al. |
| 2007/0194401 A1 | 8/2007 | Nagai et al. |
| 2007/0195056 A1 | 8/2007 | Lloyd |
| 2007/0200940 A1 | 8/2007 | Gruhlke et al. |
| 2007/0201859 A1 | 8/2007 | Sarrat |
| 2007/0235827 A1 | 10/2007 | Altice |
| 2007/0237504 A1 | 10/2007 | Nakashiba |
| 2007/0247414 A1 | 10/2007 | Roberts |
| 2007/0262366 A1 | 11/2007 | Baek et al. |
| 2007/0290283 A1 | 12/2007 | Park et al. |
| 2007/0296060 A1 | 12/2007 | Tanabe et al. |
| 2008/0002863 A1 | 1/2008 | Northcott et al. |
| 2008/0020555 A1 | 1/2008 | Shimomura et al. |
| 2008/0026550 A1 | 1/2008 | Werner et al. |
| 2008/0036022 A1 | 2/2008 | Hwang et al. |
| 2008/0044943 A1 | 2/2008 | Mazur et al. |
| 2008/0076240 A1 | 3/2008 | Veschtti et al. |
| 2008/0099804 A1 | 5/2008 | Venezia |
| 2008/0121280 A1 | 5/2008 | Carnel et al. |
| 2008/0121805 A1 | 5/2008 | Tweet et al. |
| 2008/0158398 A1 | 7/2008 | Yoel et al. |
| 2008/0170173 A1 | 7/2008 | Park et al. |
| 2008/0173620 A1 | 7/2008 | Grek |
| 2008/0174685 A1* | 7/2008 | Shan ............... H01L 27/14654 348/308 |
| 2008/0178932 A1 | 7/2008 | Den Boer et al. |
| 2008/0179762 A1 | 7/2008 | Cho et al. |
| 2008/0191310 A1 | 8/2008 | Wu et al. |
| 2008/0192132 A1 | 8/2008 | Bechtel et al. |
| 2008/0192133 A1* | 8/2008 | Abiru ................ H04N 3/1568 348/302 |
| 2008/0196761 A1 | 8/2008 | Nakano et al. |
| 2008/0198251 A1* | 8/2008 | Xu ..................... H04N 5/3532 348/297 |
| 2008/0202576 A1 | 8/2008 | Hieslmair |
| 2008/0213936 A1 | 9/2008 | Hatai |
| 2008/0223436 A1 | 9/2008 | den Boer et al. |
| 2008/0242005 A1 | 10/2008 | Dozen et al. |
| 2008/0257409 A1 | 10/2008 | Li et al. |
| 2008/0258604 A1 | 10/2008 | Mazur et al. |
| 2008/0266434 A1 | 10/2008 | Sugawa et al. |
| 2008/0266435 A1 | 10/2008 | Agranov et al. |
| 2008/0281174 A1 | 11/2008 | Dietiker |
| 2008/0284884 A1 | 11/2008 | Eiji et al. |
| 2008/0309913 A1 | 12/2008 | Fallon |
| 2009/0002528 A1* | 1/2009 | Manabe ............. H04N 5/2355 348/248 |
| 2009/0014056 A1 | 1/2009 | Hockaday |
| 2009/0027640 A1 | 1/2009 | Shibazaki |
| 2009/0038669 A1 | 2/2009 | Atanackovic |
| 2009/0039397 A1 | 2/2009 | Chao |
| 2009/0050944 A1 | 2/2009 | Hong |
| 2009/0056797 A1 | 3/2009 | Barnett et al. |
| 2009/0057536 A1 | 3/2009 | Hirose |
| 2009/0065051 A1 | 3/2009 | Chan et al. |
| 2009/0078316 A1 | 3/2009 | Khazeni et al. |
| 2009/0093100 A1 | 4/2009 | Chen |
| 2009/0095887 A1 | 4/2009 | Saveliev |
| 2009/0097290 A1 | 4/2009 | Chandrasekaran |
| 2009/0101197 A1 | 4/2009 | Morikawa |
| 2009/0109305 A1 | 4/2009 | Dai et al. |
| 2009/0114630 A1 | 5/2009 | Hawryluk |
| 2009/0142879 A1 | 6/2009 | Isaka et al. |
| 2009/0146240 A1 | 6/2009 | Carey, III et al. |
| 2009/0160983 A1 | 6/2009 | Lenchenkov |
| 2009/0180010 A1 | 7/2009 | Adkisson et al. |
| 2009/0194671 A1 | 8/2009 | Nozaki et al. |
| 2009/0200454 A1 | 8/2009 | Barbier et al. |
| 2009/0200586 A1 | 8/2009 | Mao et al. |
| 2009/0200626 A1 | 8/2009 | Qian et al. |
| 2009/0200631 A1 | 8/2009 | Tai et al. |
| 2009/0206237 A1 | 8/2009 | Shannon et al. |
| 2009/0211627 A1 | 8/2009 | Meier et al. |
| 2009/0213883 A1 | 8/2009 | Mazur et al. |
| 2009/0218493 A1 | 9/2009 | McCaffrey et al. |
| 2009/0223561 A1 | 9/2009 | Kim et al. |
| 2009/0227061 A1 | 9/2009 | Bateman et al. |
| 2009/0242032 A1 | 10/2009 | Yamazaki et al. |
| 2009/0242933 A1 | 10/2009 | Hu et al. |
| 2009/0256156 A1 | 10/2009 | Hsieh |
| 2009/0256226 A1 | 10/2009 | Tatani et al. |
| 2009/0261255 A1 | 10/2009 | Nakamura et al. |
| 2009/0283807 A1 | 11/2009 | Adkisson et al. |
| 2009/0294787 A1 | 12/2009 | Nakaji et al. |
| 2009/0308450 A1 | 12/2009 | Adibi et al. |
| 2009/0308457 A1 | 12/2009 | Smith |
| 2010/0000597 A1 | 1/2010 | Cousins |
| 2010/0013036 A1 | 1/2010 | Carey |
| 2010/0013039 A1 | 1/2010 | Qian et al. |
| 2010/0013593 A1 | 1/2010 | Luckhardt |
| 2010/0024871 A1 | 2/2010 | Oh et al. |
| 2010/0032008 A1 | 2/2010 | Adekore |
| 2010/0037952 A1 | 2/2010 | Lin |
| 2010/0038523 A1 | 2/2010 | Venezia et al. |
| 2010/0038542 A1 | 2/2010 | Carey et al. |
| 2010/0040981 A1 | 2/2010 | Kiesel et al. |
| 2010/0044552 A1 | 2/2010 | Chen |
| 2010/0051809 A1 | 3/2010 | Onat et al. |
| 2010/0052088 A1 | 3/2010 | Carey |

(56) References Cited

U.S. PATENT DOCUMENTS

| | | |
|---|---|---|
| 2010/0053382 A1 | 3/2010 | Kuniba |
| 2010/0055887 A1 | 3/2010 | Piwczyk |
| 2010/0059385 A1 | 3/2010 | Li |
| 2010/0059803 A1 | 3/2010 | Gidon et al. |
| 2010/0072349 A1 | 3/2010 | Veeder |
| 2010/0074396 A1 | 3/2010 | Schmand et al. |
| 2010/0083997 A1 | 4/2010 | Hovel |
| 2010/0084009 A1 | 4/2010 | Carlson et al. |
| 2010/0096718 A1 | 4/2010 | Hynecek et al. |
| 2010/0097609 A1 | 4/2010 | Jaeger et al. |
| 2010/0102206 A1 | 4/2010 | Cazaux et al. |
| 2010/0109060 A1 | 5/2010 | Mao et al. |
| 2010/0116312 A1 | 5/2010 | Peumans et al. |
| 2010/0117181 A1 | 5/2010 | Kim et al. |
| 2010/0118172 A1 | 5/2010 | McCarten et al. |
| 2010/0128937 A1 | 5/2010 | Yoo et al. |
| 2010/0133635 A1 | 6/2010 | Lee et al. |
| 2010/0140733 A1 | 6/2010 | Lee et al. |
| 2010/0140768 A1 | 6/2010 | Zafiropoulo et al. |
| 2010/0143744 A1 | 6/2010 | Gupta |
| 2010/0147383 A1 | 6/2010 | Carey et al. |
| 2010/0200658 A1 | 8/2010 | Olmstead et al. |
| 2010/0219506 A1 | 9/2010 | Gupta |
| 2010/0224229 A1 | 9/2010 | Pralle et al. |
| 2010/0240169 A1 | 9/2010 | Petti et al. |
| 2010/0245647 A1 | 9/2010 | Honda et al. |
| 2010/0258176 A1 | 10/2010 | Kang et al. |
| 2010/0264473 A1 | 10/2010 | Adkisson et al. |
| 2010/0289885 A1 | 11/2010 | Lu et al. |
| 2010/0290668 A1 | 11/2010 | Friedman et al. |
| 2010/0300505 A1 | 12/2010 | Chen |
| 2010/0300507 A1 | 12/2010 | Heng et al. |
| 2010/0313932 A1 | 12/2010 | Kroll et al. |
| 2011/0056544 A1 | 3/2011 | Ji et al. |
| 2011/0073976 A1 | 3/2011 | Vaillant |
| 2011/0095387 A1 | 4/2011 | Carey et al. |
| 2011/0104850 A1 | 5/2011 | Weidman et al. |
| 2011/0127567 A1 | 6/2011 | Seong |
| 2011/0140221 A1 | 6/2011 | Venezia et al. |
| 2011/0194100 A1 | 8/2011 | Thiel et al. |
| 2011/0220971 A1 | 9/2011 | Haddad |
| 2011/0227138 A1 | 9/2011 | Haddad |
| 2011/0251478 A1 | 10/2011 | Wieczorek |
| 2011/0260059 A1 | 10/2011 | Jiang et al. |
| 2011/0266644 A1 | 11/2011 | Yamamura et al. |
| 2011/0292380 A1 | 12/2011 | Bamji |
| 2011/0303999 A1 | 12/2011 | Sakamoto et al. |
| 2012/0024364 A1 | 2/2012 | Carey et al. |
| 2012/0038811 A1 | 2/2012 | Ellis-monaghan et al. |
| 2012/0043637 A1 | 2/2012 | King et al. |
| 2012/0049242 A1 | 3/2012 | Atanackovic et al. |
| 2012/0111396 A1 | 5/2012 | Saylor et al. |
| 2012/0171804 A1 | 7/2012 | Moslehi et al. |
| 2012/0187190 A1 | 7/2012 | Wang et al. |
| 2012/0222396 A1 | 9/2012 | Clemen |
| 2012/0291859 A1 | 11/2012 | Vineis et al. |
| 2012/0300037 A1 | 11/2012 | Laudo |
| 2012/0305063 A1 | 12/2012 | Moslehi et al. |
| 2012/0312304 A1 | 12/2012 | Lynch et al. |
| 2012/0313204 A1 | 12/2012 | Haddad et al. |
| 2012/0313205 A1 | 12/2012 | Haddad et al. |
| 2012/0326008 A1 | 12/2012 | Mckee et al. |
| 2013/0001553 A1 | 1/2013 | Vineis et al. |
| 2013/0082343 A1 | 4/2013 | Fudaba et al. |
| 2013/0135439 A1 | 5/2013 | Kakuko et al. |
| 2013/0168792 A1 | 7/2013 | Haddad et al. |
| 2013/0168803 A1 | 7/2013 | Haddad et al. |
| 2013/0200251 A1 | 8/2013 | Velichko |
| 2013/0207214 A1 | 8/2013 | Haddad et al. |
| 2013/0285130 A1 | 10/2013 | Ting |
| 2014/0198240 A1 | 7/2014 | Rhoads |
| 2014/0247378 A1* | 9/2014 | Sharma ............ H04N 5/35536 348/280 |

FOREIGN PATENT DOCUMENTS

| | | |
|---|---|---|
| DE | 19838439 | 4/2000 |
| EP | 0473439 | 3/1992 |
| EP | 0566156 | 10/1993 |
| EP | 1630871 | 1/2006 |
| EP | 1873840 | 1/2008 |
| EP | 2073270 | 5/2012 |
| EP | 2509107 | 10/2012 |
| FR | 2827707 | 1/2003 |
| GB | 2030766 | 4/1980 |
| JP | S5771188 | 5/1982 |
| JP | S57173966 | 10/1982 |
| JP | S63116421 | 5/1988 |
| JP | H02152226 | 6/1990 |
| JP | H02237026 | 9/1990 |
| JP | H03183037 | 8/1991 |
| JP | H04318970 | 11/1992 |
| JP | H06104414 | 4/1994 |
| JP | H06244444 | 9/1994 |
| JP | H06267868 | 9/1994 |
| JP | H06275641 | 9/1994 |
| JP | 2007183484 | 7/1995 |
| JP | 9148594 | 6/1997 |
| JP | H09298308 | 11/1997 |
| JP | 11077348 | 3/1999 |
| JP | 11097724 | 4/1999 |
| JP | 2000164914 | 6/2000 |
| JP | 2001007381 | 1/2001 |
| JP | 2001024936 | 1/2001 |
| JP | 2001189478 | 7/2001 |
| JP | 2001257927 | 9/2001 |
| JP | 2001339057 | 12/2001 |
| JP | 2002043594 | 2/2002 |
| JP | 2002134640 | 5/2002 |
| JP | 2002513176 | 5/2002 |
| JP | 2003163360 | 6/2003 |
| JP | 2003242125 | 8/2003 |
| JP | 2003258285 | 9/2003 |
| JP | 2003308130 | 10/2003 |
| JP | 2004273886 | 9/2004 |
| JP | 2005339425 | 12/2005 |
| JP | 2006173381 | 6/2006 |
| JP | 2006255430 | 9/2006 |
| JP | 2007165909 | 6/2007 |
| JP | 2007180642 | 7/2007 |
| JP | 2007180643 | 7/2007 |
| JP | 2007305675 | 11/2007 |
| JP | 2008187003 | 8/2008 |
| JP | 2008283219 | 11/2008 |
| JP | 2009021479 | 1/2009 |
| JP | 2009152569 | 7/2009 |
| JP | 2010278472 | 12/2010 |
| JP | 2011091128 | 5/2011 |
| KR | 2001/0061058 | 4/2001 |
| KR | 2005039273 | 4/2005 |
| KR | 100825808 | 4/2008 |
| KR | 20090077274 | 7/2009 |
| KR | 20100118864 | 11/2010 |
| KR | 20060052278 | 5/2016 |
| WO | WO 91/14284 | 9/1991 |
| WO | WO 0013179 | 6/2000 |
| WO | WO 0241363 | 5/2002 |
| WO | WO 03/059390 | 7/2003 |
| WO | WO 2006/086014 | 8/2006 |
| WO | WO 2008091242 | 7/2008 |
| WO | WO 2008099524 | 8/2008 |
| WO | WO 2008145097 | 12/2008 |
| WO | WO 2009016846 | 2/2009 |
| WO | WO 2009100023 | 8/2009 |
| WO | WO 2009147085 | 12/2009 |
| WO | WO 2010033127 | 3/2010 |
| WO | WO 2011003871 | 1/2011 |
| WO | WO 2011035188 | 3/2011 |
| WO | WO 2011119618 | 3/2011 |

(56) References Cited

FOREIGN PATENT DOCUMENTS

| WO | WO 2012174752 | 12/2012 |
|----|---------------|---------|
| WO | WO 2014110484 | 7/2014 |

OTHER PUBLICATIONS

International Preliminary Report on Patentability, mailed Aug. 18, 2015, in corresponding PCT/US2014/016979,(7 pages).
Solhusvik, J. et al. "A 1280×960 3.75um pixel CMOS imager with Triple Exposure HDR," Proc. of 2009 International Image Sensor Workshop, Bergen, Norway, Jun. 22-28, 2009.
A. Arndt, J.F. Allison, J.G. Haynos, and A. Meulenberg, Jr., "Optical Properties of the COMSAT Non-reflective Cell," 11th IEEE Photovoltaic Spec. Conf., p. 40, 1975.
Asom et al., Interstitial Defect Reactions in Silicon; Appl. Phys. Lett.; Jul. 27, 1987; pp. 256-258; vol. 51(4); American Institute of Physics.
Berger, Michael; Moth Eyes Inspire Self-Cleaning Antireflection Nanotechnology Coatings; 2008; 3 pages; Nanowerk LLC.
Berger, O., Inns, D. and Aberle, A.E. "Commercial White Paint as Back Surface Reflector for Thin-Film Solar Cells", Solar Energy Materials & Solar Cells, vol. 91, pp. 1215-1221,2007.
Betta et al.; Si-PIN X-Ray Detector Technology; Nuclear Instruments and Methods in Physics Research; 1997; pp. 344-348; vol. A, No. 395; Elsevier Science B.V.
Boden, S.A. et al.; Nanoimprinting for Antireflective Moth-Eye Surfaces; 4 pages; 2008.
Bogue: "From bolometers to beetles: the development of the thermal imaging sensors;" sensor Review; 2007; pp. 278-281; Emerald Group Publishing Limited (ISSN 0260-2288).
Borghesi et al.; "Oxygen Precipitation in Silicon," J. Appl. Phys., v. 77(9), pp. 4169-4244 (May 1, 1995).
Born, M. and E.Wolf, "Princip les of Optics, 7th Ed.", Cambridge University Press, 1999, pp. 246-255.
Brieger,S., O.Dubbers, S.Fricker, A.Manzke, C.Pfahler, A.Plettl, and P.Zlemann, "An Approach for the Fabrication of Hexagonally Ordered Arrays of Cylindrical Nanoholes in Crystalline and Amorphous Silicon Based on the Self-Organization of Polymer Micelles", Nanotechnology, vol. 17, pp. 4991-4994, 2006, doi:10.1088/0957-4884/17/19/036.
Buttgen, B.; "Demodulation Pixel Based on Static Drift Fields"; IEEE Transactions on Electron Devices, vol. 53, No. 11, Nov. 2006.
Carey et al., "Femtosecond-Laser-Assisted Microstructuring of Silicon Surfaces", Optics and Photonics News, 2003. 14, 32-36.
Carey, et al. "Femtosecond Laser-Assisted Microstructuring of Silicon for Novel Detector, Sensing and Display Technologies", LEOS 2003, 481-482, Tuscon, AR.
Carey, et al. "Femtosecond Laser-Assisted Microstructuring of Silicon for Novel Detector, Sensing and Display Technologies", LEOS; 2002, 97-98, Glasgos, Scotland, 2002.
Carey, et al., "Fabrication of Micrometer-Sized Conical Field Emitters Using Femtosecond Laser-Assisted Etching of Silicon," Proc. IVMC 2001, 75-76, UC Davis, Davis, CA.
Carey, et al., "Field Emission from Silicon. Microstructures Formed by Femtosecond Laser Assisted Etching," Proc. CLEO 2001 (Baltimore, MD 2001) 555-557.
Carey, et al., "High Sensitivity Silicon-Based VIS/NIR Photodetectors", Optical Society of America (2003) 1-2.
Carey, III; "Femtosecond-laser Microstructuring of Silicon for Novel Optoelectronic Devices"; Harvard University, Jul. 2004; (Thesis).
Chang, S.W., V.P.Chuang, S.T.Boles, and C.V.Thompson, "Metal-Catalyzed Etching of Vertically Aligned Polysilicon and Amorphous Silicon Nanowire Arrays by Etching Direction Confinement", Advanced Functional Materials, vol. 20, No. 24, pp. 4364-4370, 2010.
Chen, Q. et al.; Broadband moth-eye antireflection coatings fabricated by low-cost nanoimprinting; Applied Physics Letters 94; pp. 263118-1-263118-3; 2009; American Institute of Physics.
Chien et al, "Pulse Width Effect in Ultrafast Laser Processing of Materials," Applied Physics A, 2005, 1257-1263, 81, Springer Berlin, Heidelberg, Germany.
CMOSIS; "Global Shutter Image Sensors for Machine Vision Application"; Image Sensors Europe 2010, Mar. 23-25, 2010; .COPYRGT. copyright 2010.
Cotter, Jeffrey E.; Optical intensity of light in layers of silicon with rear diffuse reflectors; Journal of Applied Physics; Jul. 1, 1998; pp. 618-624; vol. 84, No. 1; American Institute of Physics.
Crouch et al., "Comparison of Structure and Properties of Femtosecond and Nanosecond Laser-Structured Silicon" Appl. Phys. Lett., 2004, 84,1850-1852.
Crouch et al., "Infrared Absorption by Sulfur-Doped Silicon Formed by Femtosecond Laser Irradiation", Appl. Phys. A, 2004, 79, 1635-1641.
Despeisse, et al.; "Thin Film Silicon Solar Cell on Highly Textured Substrates for High Conversion Efficiency"; 2004.
Detection of X-ray and Gamma-ray Photons Using Silicon Diodes; Dec. 2000; Detection Technology, Inc.; Micropolis, Finland.
Dewan, Rahul et al.; Light Trapping in Thin-Film Silicon Solar Cells with Submicron Surface Texture; Optics Express; vol. 17, No. 25; Dec. 7, 2009; Optical Society of America.
Deych et al.; Advances in Computed Tomography and Digital Mammography; Power Point; Nov. 18, 2008; Analogic Corp.; Peabody, MA.
Dobie, et al.; "Minimization of reflected light in photovoltaic modules"; Mar. 1, 2009.
Dobrzanski, L.A. et al.; Laser Surface Treatment of Multicrystalline Silicon for Enhancing Optical Properties; Journal of Materials Processing Technology; p. 291-296; 2007; Elsevier B.V.
Dolgaev et al., "Formation of Conical Microstructures Upon Laser Evaporation of Solids", Appl. Phys. A, 2001, 73, 177-181.
Duerinckx, et al.; "Optical Path Length Enhancement for >13% Screenprinted Thin Film Silicon Solar Cells"; 2006.
Dulinski, Wojciech et al.; Tests of backside illumincated monolithic CMOS pixel sensor in an HPD set-up; Nuclear Instruments and methods in Physics Research; Apr. 19, 2005; pp. 274-280; Elsevier B.V.
Forbes; "Texturing, reflectivity, diffuse scattering and light trapping in silicon solar cells"; 2012.
Forbes, L. and M.Y. Louie, "Backside Nanoscale Texturing to Improve IR Response of Silicon Photodetectors and Solar Cells," Nanotech, vol. 2, pp. 9-12, Jun. 2010.
Fowlkes et al., "Surface Microstructuring and Long-Range Ordering of Silicon Nanoparticles", Appl. Phys. Lett., 2002, 80 (20), 3799-3801.
Gjessing, J. et al.; 2D back-side diffraction grating for impored light trapping in thin silicon solar cells; Optics Express; vol. 18, No. 6; pp. 5481-5495; Mar. 15, 2010; Optical Society of America.
Gjessing, J. et al.; 2D blazed grating for light trapping in thin silicon solar cells; 3 pages; 2010; Optical Society of America.
Goetzberger, et al.; "Solar Energy Materials & Solar Cells"; vol. 92 (2008) pp. 1570-1578.
Han et al., "Evaluation of a Small Negative Transfer Gate Bias on the Performance of 4T CMOS Image Sensor Pixels," 2007 International Image Sensor Workshop, 238-240, Ogunquit, Maine.
Haug, et al.; "Light Trapping effects in thin film silicon solar cells"; 2009.
Her et al., "Microstructuring of Silicon with Femtosecond Laser Pulses," Applied Physics Letters, 1998, 1673-1675, vol. 73, No. 12, American Institute of Physics.
Her et al., "Novel Conical Microstructures Created in Silicon With Femtosecond Laser Pulses", CLEO 1998, 511-512, San Francisco, CA.
Her, et al., "Femtosecond laser-induced formation of spikes on silicon," Applied Physics A, 2000, 70, 383-385.
Hermann, S. et al.; Impact of Surface Topography and Laser Pulse Duration for Laser Ablation of Solar Cell Front Side Passivating SiNx Layers; Journal of Applied Physics; vol. 108, No. 11; pp. 114514-1-114514-8; 2010; American Institute of Physics.
High-Performance Technologies for Advanced Biomedical Applications; .COPYRGT. 2004Brochure; pp. 1-46; PerkinElmerOptoelectronics.

(56) References Cited

OTHER PUBLICATIONS

Holland; Fabrication of Detectors and Transistors on High-Resistivity Silicon; Nuclear Instruments and Methods in Physics Research, vol. A275, pp. 537-541 (1989).

Hong et al., "Cryogenic processed metal-semiconductor-metal (MSM) photodetectors on MBE grown ZnSe,", 1999, IEEE Transactions on Electron Devices, vol. 46, No. 6, pp. 1127-1134.

Hsieh et al., "Focal-Plane-Arrays and CMOS Readout Techniques of Infrared Imaging Systems," IEE Transactions on Circuits and Systems for Video Technology, 1997, vol. 7, No. 4, Aug. 1997, 594-605.

Hu et al., "Solar Cells from Basic to Advanced Systems," McGraw Hill Book Co., 1983, 39, New York, New York.

Huang, et al.; "Microstructured silicon photodetector"; Applied Physics Letters 89, 033506; 2006 American Institute of Physics; 2006.

Hüpkes, J. et al.; Light Scattering and Trapping in Different Thin Film Photovoltaic Devices; 24th European Photovoltaic Solar Energy Conference, Hamburg, Germany (Sep. 21-25, 2009); pp. 2766-2769.

"Infrared Absorption by Sulfur-Doped Silicon formed by Femtosecond Laser Irradiation"; Springer Berline/Heidelberg, vol. 79, Nov. 2004.

Job et al., "Doping of Oxidized Float Zone Silincon by Thermal Donors—A low Thermal Budget Doping Method for Device Applications?" Mat. Res. Soc. Symp. Pro.; v. 719, F9.5.1-F9.5.6 (2002).

Joy, T. et al.; Development of a Production-Ready, Back-Illuminated CMOS Image Sensor with Small Pixels; Electron Devices Meeting; pp. 1007-1010; 2007; IEEE.

Juntunen et al.; Advanced Photodiode Detector for Medical CT Imaging: Design and Performance; 2007; pp. 2730-2735; IEEE.

Kim et al.; "Strong Sub-Band-Gap Infrared Absorption in Silicon Supersaturated with Sulfur"; 2006 Appl. Phys. Lett. 88, 241902-1-241902-3.

Kolasinski et al., "Laser Assisted and Wet Chemical Etching of Silicon Nanostructures," J. Vac. Sci. Technol., A 24(4), Jul./Aug. 2006, 1474-1479.

Konstantatos et al., "Engineering the Temproal Response of Photoconductive Photodetectors via Selective Introduction of Surface Trap States," Nano Letters, v. 8(5), pp. 1446-1450 (Apr. 2, 2008).

Konstantatos et al., "PbS Colloidal Quantum Dot Photoconductive Photodetectors: Transport, Traps, and Gain," Appl. Phys. Lett., v. 91, pp. 173505-1-173505-3 (Oct. 23, 2007).

Kray, D. et al.; Laser-doped Silicon Soalr Cells by Laser Chemical Processing (LCP) exceeding 20% Efficiency; 33rd IEEE Photovoltaic Specialist Conference; 3 pages; May 2008; IEEE.

Kroning et al.; X-ray Imaging Systems for NDT and General Applications; 2002; Fraunhofer Institute for Nondestructive Testing; Saarbrucken and Dresden, Germany.

Kryski; A High Speed 4 Megapixel Digital CMOS Sensor; 2007 International Image Sensor Workshop; Jun. 6-10, 2007.

Li, "Design and Simulation of an Uncooled Double-Cantilever Microbolometer with the Potential for .about.mK NETD," 2004, Sensors and Actuators A, 351-359, vol. 112, Elsevier B.V.

Li et al., "Gettering in High Resistive Float Zone Silicon Wafers," Transaction on Nuclear Science, vol. 36(1), pp. 290-294 (Feb. 1, 1989).

Li, Hongsong et al.; An experimental study of the correlation between surface roughness and light scattering for rough metallic surfaces; Advanced Characterization Techniques for Optics, Semiconductors, and Nanotechnologies II; 2005; pp. 25780V-1-25780V-15; vol. 5878; SPIE Bellingham, WA.

Lin, A. et al.; Optimization of Random Diffraction Gratings in Thin-Film Solar Cells Using Genetic Algorithms; 2007; 1 page; SSEL Annual Report.

Low Dose Technologies; Power Point.

Madzharov, et al.; "Light trapping in thin-firm silicon solar cells for superstrate and substrate configuration" Abstract #1614, 218.sup.th ECS Meeting .COPYRGT. 2010 the Electrochemical Society.

Mateus; C.F.R. et al.; Ultrabroadband Mirror Using Low-Index Cladded Subwavelength Grating; Photonics Technology Letters; vol. 16, Issue No. 2; pp. 518-520; Feb. 2004; IEEE.

Matsuno, Shigeru et al.; Advanced Technologies for High Efficiency Photovoltaic Systems; Mitsubishi Electric Advance; vol. 122; pp. 17-19; Jun. 2008.

Meynants, et al.; "Backside illuminated global shutter COMOS image sensors"; 2011 International Image Sensor Workshop; Jun. 11, 2011.

Moloney, A.M. et al.; Novel Black Silicon PIN Photodiodes; 8 pages; Jan. 25, 2006; SPIE.

Moses; Nuclear Medical Imaging—Techniques and Challenges; Power Point; Feb. 9, 2005; Lawrence Berkeley National Laboratory Department of Functional Imaging.

Murkin, JM and Arangol, M, "Near Infrared spectroscopy as an index of rain and tissue oxygenation," Bri. J. of Anathesia (BJA/PGA Supplement):13-il3 (2009).

Munday, J.N. et al.; Large Integrated Absorption Enhancement in Plasmonic Solar Cells by Combining Metallic Gratings and Antireflection Coatings; Nano Letters; vol. 11, No. 6; pp. 2195-2201; Oct. 14, 2010; American Chemical Society.

Nauka et al., Intrinsic Gettering in Oxygen-Free Silicon; App. Phys. Lett., vol. 46(7), Apr. 4, 1985.

Nauka et al., "New Intrinsic Gettering Process in Silicon Based on Interactions of Silicon Interstitials," J. App. Phys., vol. 60(2), pp. 615-621, Jul. 15, 1986.

Nayak et al, "Semiconductor Laesr Crystallization of a-Si:H," SPIE Digital Library, 2003, 277-380, vol. 4977, Bellingham, Washington. 2003.

Nayak et al, "Ultrafast-Laser-Assisted Chemical Restructuring of Silicon and Germanium Surfaces," Applied Surface Science, 2007, 6580-6583, vol. 253, Issue 15, Elsevier B.V.

Nayak et al, "Semiconductor Laser Crystallization of a-Si:H on Conducting Tin—Oxide-Coated Glass for Solar Cell and Display Applications," Applied Physics A, 2005, 1077-1080, 80, Springer Berlin, Heidelberg, Germany.

Nayak, B.K. et al.; Ultrafast Laser Textured Silicon Solar Cells; Mater. Res. Soc. Symp. Proc.; vol. 1123; 6 pages; 2009; Materials Research Society.

Nayak, et al.; "Efficient light trapping in silicon solar cells by ultrafast-laser-induced self-assembled micro/nano structures"; Progress in Photovoltaics: Research and Applications; 2011.

Oden, et al.; "Optical and Infrared Detection Using Microcantilevers;" SPIE Digital Library on Oct. 13, 2010; vol. 2744; 10 pages.

Pain, Bedabrata; Backside Illumination Technology for SOI-CMOS Image Sensors; 2009 IISW Symposium on Backside Illujination of Solid-State Image Sensors, Bergen Norway; Jun. 25, 2009; pp. 1-23.

Pain, Bedabrata; "A Back-Illuminated Megapixel CMOS Image Sensor"; http://hdl.handle.net/2014/39312; May 1, 2005.

Payne, D.N.R. et al.; Characterization of Experimental Textured ZnO:Al Films for Thin Film Solar Cell Applications and Comparison with Commercial and Plasmonic Alternatives; Photovoltaic Specialists Conference (PVSC); pp. 1560-1564; 2010; IEEE.

Pedraza et al., "Silicon Microcolumn Arrays Grown by Nanosecond Pulsed-Excimer Laser Irradiation", Appl. Phys. Lett., 1999, 74 (16), 2322-2324, American Institute of Physics.

Pedraza et al., "Surface Nanostructuring of Silicon", Appl. Phys. A, 2003, 77, 277-284.

Rashkeev et al., "Hydrogen passivation and Activation of Oxygen Complexes in Silicon," American Institute of Physics, vol. 78(11), pp. 1571-1573 (Mar. 12, 2001).

Russell, et al.; "Nanosecond Eximer Laser Processing for Novel Microelectronic Fabrication"; Nanosecond Excimer Laser Processing; 6 pages; 1989.

Russell, Ramirez, Kelley, "Nanosecond Excimer Laser Processing for Novel Microelectronic Fabrication," SSC Pacific Technical Reports , pp. 228-233, 2003, vol. 4, US Navy.

Sai, H. et al.; Enhancement of Light Trapping in Thin-Film Hydrogenated Microcrystalline Si Solar Cells Using Back Reflectors with Self-Ordered Dimple Pattern; Applied Physics Letters; vol. 93; 2008; American Institute of Physics.

(56) References Cited

OTHER PUBLICATIONS

Sanchez et al., "Whiskerlike Structure Growth on Silicon Exposed to ArF Excimer Laser Irradiation", Appl. Phys. Lett., 1996, 69 (5), 620-622.
Sanchez et al., "Dynamics of the Hydrodynamical Growth of Columns on Silicon Exposed to ArF Excimer-Laser Irradiation", Appl. Phys. A, 66, 83-86 (1998).
Sarnet et al.; "Femtosecond laser for black silicon and photovoltaic cells"; Feb. 21, 2008, Proc. of SPIE; vol. 6881; pags 1-15.
Senoussaoui, N. et al.; Thin-Film Solar Cells with Periodic Grating Coupler; Thin Solid Films; pp. 397-401; 2003; Elsevier B.V.
Serpenguzel et al., "Temperature Dependence of Photluminescence in Non-Crystalline Silicon", Photonics West (San Jose, CA, 2004) 454-462.
Shen et al., "Formation of Regular Arrays of Silicon Micorspikes by Femotsecond Laser Irradiation Through a Mask", Appl. Phys. Lett., 82, 1715-1717 (2003).
Solar Energy Research Institute, "Basic Photovoltaic Principles and Methods," Van Nostrand Reinhold Co., NY 1984, pp. 45-47 and 138-142.
Stone et al.; The X-ray Sensitivity of Amorphous Selenium for Mammography;.Am. Assoc. Phys. Med.; Mar. 2002; pp. 319-324; vol. 29 No. 3; Am. Assoc. Phys. Med.
Szlufcik, J. et al.; Simple Integral Screenprinting process for selective emitter polycrystalline silicon solar cells; Applied Physics Letters; vol. 59, No. 13; Sep. 23, 1991; American Institute of Physics.
Tabbal et al., "Formation of Single Crystal Sulfur Supersaturated Silicon Based Junctions by Pulsed Laser Melting". 2007, J. Vac. Sci. Technol. B25(6), 1847-1852.
Takayanagi, et al.; "A 600.times.600 Pixel, 500, fps CMOS Image Sensor with a 4.4 jum Pinned Photodiode 5-Transistor Global Shutter Pixel"; 2007 International Image Sensor Workshop; Jun. 6-10, 2007.
Tower, John R. et al.; Large Format Backside Illuminated CCD Imager for Space Surveillance; IEEE Transactions on Electron Devices, vol. 50, No. 1; Jan. 2003; pp. 218-224.
Tull; "Femtosecond Laser Ablation of Silicon: Nanoparticles, Doping and Photovotaics"; Harvard University, Jun. 2007 (Thesis).
Uehara et al., "A High-Sensitive Digital Photosensor Using MOS Interface-Trap Charge Pumping," IEICE Electronics Express, 2004, vol. 1, No. 18, 556-561.
Wilson, "Depth Distributions of Sulfur Implanted Into Silicon as a Function of Ion energy, Ion Fluence, and Anneal Temperature," 1984, Appl. Phys. 55(10, 3490-3494.
Winderbaum, S. et al.; Reactive ion etching (RIE) as a method for texturing polycrystalline silicon solar cells; Solar Energy Materials and Solar Cells; 1997; pp. 239-248; Elsevier Science B.V.
Wu et al., "Black Silicon: A New Light Absorber," APS Centennial Meeting (Mar. 23, 1999).
Wu et al., "Femtosecond laser-gas-solid interactions," Thesis presented to the Department of Physics at Harvard University, pp. 1-113, 126-136, Aug. 2000.
Wu et al., "Visible Luminescence From Silicon Surfaces Microstructured in Air". Appl. Phys. Lett., vol. 81, No. 11, 1999-2001 (2002).
Wu, et al "Near-Unity Below-Band-Gap Absorption by Microstructured Silicon," 2001, Applied Physics Letters, 1850-1852, vol. 78, No. 13, American Institute of Physics.
Xu, Y., et al, "Infrared Detection Using Thermally Isolated Diode," Sensors and Actuators A, Elsevier Sequoia S.A., 1993, vol. 36, 209-217, Lausanne, Switzerland.
Yablonovitch, et al.; "Intensity Enhancement in Textured Optical Sheets for Solar Cells"; .COPYRGT. 1982 IEEE.
Yamamoto, K. et al.; NIR Sensitivity Enhancement by Laser Treatment for Si Detectors; Nuclear Instruments and Methods in Physics Research A; pp. 520-523; Mar. 31, 2010; Elsevier.
Yan, B.; Light Trapping Effect from Randomized Textures of Ag/ZnO Back Reflector on Hyrdrogenated Amorphous and Nanocrystalline Silicon Based Solar Cells; Thin Film Solar Technology II; vol. 7771; 2010; SPIE.
Yasutomi, et al.; "Two-Stage Charge Transfer Pixel Using Pinned Diodes for Low-Noise Global Shutter Imaging"; 2009 International Image Sensor Workshop; Mar. 28, 2009.
Younkin et al., "Infrared Absorption by Conical Silicon Microstructures Made in a Variety of Background Gases Using Femtosecond-Laser Pulses", J. Appl. Phys., 93, 2626-2629 (2003).
Younkin, "Surface Studies and Microstructure Fabrication Using Femtosecond Laser Pulses," Thesis presented to the Division of Engineering & Applied sciences at Harvard University (Aug. 2001).
Yuan, et al.; "Efficient black silicon solar cell with a density-graded nanoporous surface: Optical properties, performance limitations, and design rules"; American Institute of Physics; Applied Physics Letters 95. 1230501 (2009) 3 pages.
Zaidi, S.H. et al.; Diffraction Grating Structures in Solar Cells; Photovoltaic Specialists Conference, 2000; 4 pages; Sep. 2000; IEEE.
Zhang et al, "Ultra-Shallow P+-Junction Formation in Silicon by Excimer Laser Doping: a Heat and Mass Transfer Perspective," Int. J. Heat Mass Transfer, 1996, 3835-3844, vol. 39, No. 18, Elsevier Science Ltd., Great Britain.
European Search Report, dated Jun. 28, 2016, in corresponding European Patent Application No. 14752193.4 (10 pages).
Carey, P.G. et al., "In-situ Doping of Silicon Using Gas Immersion Laser Doping (GILD) Process," Appl. Surf. Sci. 43, 325-332 (1989).
Chiang, Wen Jen et al., "Silicon Nanocrystal-Based Photosensor on Low-Temperature Polycrystalline-Silicone Panels", Applied Physics Letters, 2007, 51120-1-51120-3, Ltt. 91, American Inst. Of Physics, Melville, NY.
Chichkov, B.N. et al, "Femtosecond, picosecond and nanosecond laser ablation of solids" Appl. Phys. A 63, 109-115; 1996.
Cilingiroglu et al., "An evaluation of MOS Interface-Trap Charge Pump as and Ultralow Constant-Current Generator," IEEE Journal of Solid-State Circuit, 2003, vol. 38, No. 1, Jan. 2003, 71-83.
Clapham, P.B. et al, "Reduction of Lens Reflexion by the Moth Eye Principle" Nature, vol. 244. Aug. 1973, pp. 281-282.
Gibbons, J., "Ion Implantation in Semiconductors-Part II; Damage Production and Annealing", proceedings of the IEEE vol. 60, No. 9 pp. 1062-1096. Jun. 1972.
Gloeckler et al. Band-Gap Grading in CU(In,Ga)Se2 Solar Cells, Journal of Physics and Chemistry of Solids; 2005; pp. 189-194; vol. 66.
Igalson et al. Defect States in the Cigs Solar cells by Photocapacitance and Deep Level Optical Spectroscopy; Bulletin of the Polish Academy of Sciences Technical Sciences; 2005; pp. 157-161; vol. 53(2).
"Masimo Rainbow SET Pulse CO-Oximetry," 2010, Masimo Corporation, Irvine, California, http://www.masimo.com/Rainbow/about.htm.
Moon et al. Selective emitter using porous silicon for crystalline silicon solar cells. Solar Energy Materials & Solar Cells, v. 93, pp. 846-850 (2009).
Myers, Richard et al., "Enhancing Near-IR Avalanche Photodiodes Performance by Femtosecond Laser Microstructuring" Harvard Dept. Of Physics.
Palm et al. CIGSSe Thin Film PB Modules: From Fundamental Investigators to Advanced Performance and Stability; Thin Solid Films; 2004; pp. 544-551; vol. 451-2.
Wu et al., "Black Silicon" Harvard UPS 1999.
Zhu et al., "Evolution of Silicon Surface Microstructures by Picosecond and Femtosecond Laser Irradiations," Applied Surface Science, 2005, 102-108, Elsevie, Amsterdam, NL.Ultra-Shallow P+-Junction Formation in Silicon by Excimer Laser Doping: a Heat and Mass Transfer Perspective, Int. J. Heat Mass Transfer, 1996, 3835-3844, vol. 39, No. 18, Elsevier Science Ltd., Great Britain.
Ziou et al., "Depth from defocus using the hermite transform", Image Processing, 1998. ICIP 98. Intl. Conference on Chicago, IL. Oct. 1998 pp. 958-962.

\* cited by examiner

| Frm_valid | CDS/Shutter timing (normal) | physical row index | int1 readout | physical row index | int2 readout (3 row) | physical row index | combined output | image data row index |
|---|---|---|---|---|---|---|---|---|
| | CDS: 1 | 1 | 1 | | | 1 | 1 | 1 |
| | S: 101 | | | | | | | |
| | CDS: -2 | | | | | | | |
| | S: 1 | | | | | | | |
| | CDS: 2 | 2 | 1 | | | 2 | 1 | 2 |
| | S: 102 | | | | | | | |
| | CDS: -1 | | | | | | | |
| | S: 2 | | | | | | | |
| | CDS: 3 | 3 | 1 | | | 3 | 1 | 3 |
| | S: 103 | | | | | | | |
| | CDS: 0 | | | | | | | |
| | S: 3 | | | | | | | |
| | CDS: 4 | 4 | 1 | | | 4 | 1 | 4 |
| | S: 104 | | | | | | | |
| | CDS: 1 | | | 1 | 2 | 1 | 2 | 5 |
| | S: 4 | | | | | | | |
| | CDS: 5 | 5 | 1 | | | 5 | 1 | 6 |
| | S: 105 | | | | | | | |
| | CDS: 2 | | | 2 | 2 | 2 | 2 | 7 |
| | S: 5 | | | | | | | |
| | CDS: 6 | 6 | 1 | | | 6 | 1 | 8 |
| | S: 106 | | | | | | | |
| | CDS: 3 | | | 3 | 2 | 3 | 2 | 9 |
| | S: 6 | | | | | | | |
| | CDS: 7 | 7 | 1 | | | 7 | 1 | 10 |
| | S: 107 | | | | | | | |
| | CDS: 4 | | | 4 | 2 | 4 | 2 | 11 |
| | S: 7 | | | | | | | |

HIGH DYNAMIC RANGE CMOS IMAGE SENSOR HAVING ANTI-BLOOMING PROPERTIES AND ASSOCIATED METHODS

PRIORITY DATA

This application claims the benefit of U.S. Provisional Application Ser. No. 61/765,599, filed on Feb. 15, 2013, which is incorporated herein by reference.

BACKGROUND

In general, CMOS image sensors tend to have a limited dynamic range due to well capacity limitations. Various approaches have been attempted to improve dynamic range using such sensors, such as, for example, multiple exposure, lateral overflow, logarithmic pixel, in-pixel delta-sigma ADC, pixel with multiple-size-photodiodes, pixel arrays with different neutral density filters, dual conversion gain, etc. The multiple exposure approach is one common technique for high dynamic range (HDR) imaging.

In lateral overflow HDR schemes, pixel integration time is divided into two or more segments. In each segment, the effective pixel well capacity is varied. At the end of integration, the total accumulated charge is readout. However, this approach normally has fixed pattern noise at each knee point (the time at which an intermediary reset voltage is applied) on the signal response curve. Lateral overflow approaches also tend to be flexible regarding dynamic range extension.

Delta-sigma ADC (Analog to Digital Converter) is a method for encoding analog signals into digital signals or for encoding high-resolution signals to lower-resolution signals. In the in-pixel delta-sigma ADC scheme, each pixel's integration time is individually controlled. This approach in theory can provide the best HDR scene capture and is the most flexible to achieve the highest possible dynamic range. However, the pixel size is large, complex and not appealing for most consumer applications.

In multiple-diode-pixel systems, each pixel has multiple photodiodes. The effective sensitivity of two photodiodes can thus be made different by design. Therefore, the HDR scene multiple-exposure can be achieved simultaneously. However, the enhanced dynamic rage is fixed in design and it is not flexible.

BRIEF DESCRIPTION OF THE DRAWINGS

For a fuller understanding of the nature and advantage of the present invention, reference is being made to the following detailed description of preferred embodiments and in connection with the accompanying drawings, in which:

FIG. 4 is a graphical representation of a 2-pointer HDR image sensor readout and shutter timing scheme, in accordance with another aspect of the present disclosure.

FIG. 5 is a graphical representation of a 2-pointer HDR image sensor readout and shutter timing scheme, in accordance with another aspect of the present disclosure.

DETAILED DESCRIPTION

Figure 1:
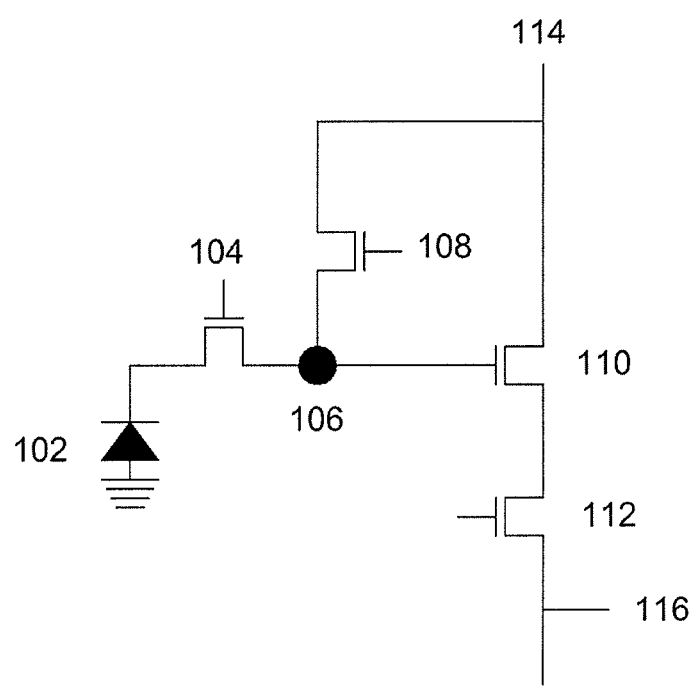
FIG. 1 is a schematic diagram of a four transistor CMOS image sensor pixel in accordance with one aspect of the present disclosure.

Before the present disclosure is described herein, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

DEFINITIONS

The following terminology will be used in accordance with the definitions set forth below.

It should be noted that, as used in this specification and the appended claims, the singular forms "a," and, "the" include plural referents unless the context clearly dictates otherwise. Thus, for example, reference to "a pixel" includes one or more of such pixels and reference to "the shutter" includes reference to one or more of such shutters.

In this application, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term, like "comprising" or "including," it is understood that direct support should be afforded also to "consisting essentially of" language as well as "consisting of" language as if stated explicitly, and vice versa. Further, it is to be understood that the listing of components, species, or the like in a group is done for the sake of convenience and that such groups should be interpreted not only in their entirety, but also as though each individual member of the group has been articulated separately and individually without the other members of the group unless the context dictates otherwise. This is true of groups contained both in the specification and claims of this application. Additionally, no individual member of a group should be construed as a de facto equivalent of any other member of the same group solely based on their presentation in a common group without indications to the contrary.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

THE DISCLOSURE

The presently disclosed technology provides systems, methods, and devices for use in capturing high dynamic range (HDR) images using CMOS imagers. More specifically, blooming protection is provided through the strategic use of shuttering, particularly between images captured at different integration times. These novel techniques can reduce blooming issues that apply to any row-wise HDR CMOS imager such as, for example, rolling shutter CMOS imagers.

CMOS image sensors generally include an array of pixels arranged in rows and columns. Each pixel can generally include a photodiode and a transfer gate, which is used in image readout to control the transfer of collected charge from the photodiode. Imagers can further include a reset gate used to reset or shutter a plurality of pixels (i.e. one or more rows of pixels in some aspects), a row select transistor, among others. It is noted that CMOS imagers are well known in the art, and as such any known component or design incorporated into an imager using a row-wise readout scheme should be considered to be within the present scope. As examples, CMOS imagers having four transistor (4T), 5T, or more can be utilized. One non-limiting example of a 4T CMOS imager is shown in FIG. 1. Such a device can include a photodiode 102, a transfer transistor 104, a floating diffusion region 106, a reset 108, source follower 110, a row select 112, a power supply voltage for the pixel array 114, and the voltage out 116.

Row-wise readout, also known as rolling shutter, is often used as a mechanism in CMOS imaging to control exposure time of the pixels to incident light. The rolling shutter is an electronic shutter that operates at the level of the pixel, and rolls along the pixel array row-by-row. When a row is selected to be shuttered, a reset voltage is applied to the pixel via a reset transistor and a voltage is applied to the transfer gate, thus clearing the contents of the photodiode of the pixel and placing the pixel in a reset state. While in the reset state, the pixel does not accumulate charge from incoming photons. Once the reset voltage and the transfer gate voltage has been removed, the pixel is capable of absorbing incoming photons and accumulating the resulting charge. In one non-limiting example of a typical rolling shutter process, rows of pixels in the imager can be reset in sequence, starting, for example, at the top of the array and proceeding row-by-row to the bottom of the array. It is noted, however, that rolling shutter processes can move from any point in the array to another, and that such is merely exemplary. Once the reset operation has moved past a row of pixels, charge integration begins. Following a given integration time, set by the device or the user, the readout operation begins. Rows can be read out of the pixel array in the order of the rolling shutter to maintain a constant integration time for each row. Thus, the exposure time for the pixel array is controlled by the timing difference between the passing of the rolling shutter and readout of the rows of the array. This exposure time is often referred to as the integration time. Increasing the integration time increases the duration that the pixels are accumulating charge, while decreasing the integration time decreases charge accumulation.

One common problem that can arise when capturing an image, particularly with a long integration time, is referred to as "blooming." A pixel has a limited charge-well capacity, and thus can only accumulate a fixed amount of charge. When this well is full, and particularly then the pixel continues to convert photons to charge, excess charge can spill over into neighboring pixels, thus corrupting the associated charge concentration in those pixels. This negative effect can also spill over into pixels multiple rows away, depending on the relative charge between the source of the blooming and the affected rows, the pixel size, the epitaxial layer thickness, etc. This can be particularly problematic for imaging scenes with bright light on a dark background, such as, for example, car headlights in the dark. Such blooming thus spreads, causing unwanted noise throughout at least portions of the image.

As has been described, multiple exposure imaging is one technique for generating high dynamic range (HDR) images with CMOS technology. HDR images captures a greater dynamic range between the lightest and darkest regions of a given scene as compared to normal imaging technologies. Common HDR scenes occur when there is a large contrast of light intensity between objects in the scene, such as illumination of a car's headlights at night. In multiple exposure HDR schemes, multiple images are taken at different integration times for each frame for the same scene. Afterwards, the multiple images are combined to reconstruct the final image. Typically, the multiple exposure HDR schemes can be frame-wise or row-wise. In a frame-wise HDR scheme, two (or more) frames are readout sequentially, meaning the whole focal plane array is read out at least twice and combined to create the HDR image. The first frame will have a predetermined integration time, also known as exposure time, and the second frame will have a predetermined integration time. Typically, the frame for capturing the low lighting intensities in a scene will have a longer exposure or integration time than the frame capturing regular lighting intensities or high intensities of a given scene. Once the raw image data from the two frames has been read out, they are combined to create a HDR image. In row-wise HDR imaging, on the other hand, every row is read out multiple times in a single frame image, in which each readout has an integration time, which can, in some cases, be different integration times. For a three exposure HDR readout scheme, for example, each row is read out three times at different integration times. To reconstruct the final HDR image, the raw image data from a row-wise HDR is separated into individual frame data first. Both frame-wise and row-wise HDR approaches are flexible regarding extended dynamic range and can be applied to most CMOS imager with minimal design changes. However, both designs can utilize on-chip or off-chip memory to store the image data before final image re-construction.

One implementation of a row-wise HDR imaging scheme initiates a first image process having a longer integration time exposure using a rolling shutter, with a second image process having a shorter integration time being initiated following the readout of the first image. In situations where blooming occurs in the longer integration time image, such blooming charge can cross the reset pixels into the second image having the shorter integration time, thus causing undesirable noise. As one example, assume a rolling shutter one row wide rolls across a pixel array, initiating integration. At the end of a 100 row integration time, each row is read out and reset with a second rolling shutter, again 1 row wide, that initiates integration of the pixels for a shorter 3 row integration time. In this case, rows that have yet to be read out for the long integration time may have wells with sufficient charge to bloom, and as such can cross the second rolling shutter prior to readout of the row, causing corruption of the charge in the pixels undergoing short integration.

The present technology reduces or eliminates such undesirable blooming through the strategic use of shuttering to limit the blooming across the rows that are being reset or shuttered following readout of the long integration time image. Such strategic shuttering can be accomplished in a variety of ways, such as, for example, variation in the number of rows shuttered, the pattern of the rows shuttered, temporal variations in the shuttering voltage, and the like. In one aspect, the number of shuttered rows can be increased that are directly adjacent to one another. In this case, readout of the long integration time is followed up by a shutter that is 2, 3, 4, or more rows wide. Following this extended shutter, the reset is removed and the pixels are allowed to integrate for the short integration time. Charge from pixels having full charge wells that have not yet been read out in the long integration time region is thus precluded or limited from crossing the multiple row shutter, or in other words, the multiple rows that are in the reset state. In the case of a 4 row shutter, for example, a given row is read out for the long integration time image, followed by a reset that is present for the next 3 row readouts. The reset of the given row is then release, and the short integration time is initiated. The last row read out is shuttered and the 4-row rolling shutter moves across the pixel array in a row-wise manner, thus providing bloom protection to the shorter integration time region. Note that the beginning of the short integration time may be delayed compared to a traditional rolling shutter due to the width of the reset.

Furthermore, it is noted that the present technology is not limited to HDR imaging having only two integrations times, but the same or similar imaging process can be applied for a third, fourth, or more images having different integration times. Thus, in the above example, when the given row is read out for the second integration time, the row can be reset with a shutter having characteristics to provide bloom protection to a third integration image, and so on.

A variety of shutter configurations and shutter behaviors are contemplated, and can include any shutter scheme that provides blooming protection to HDR images. In general the shutter has at least two rows of pixels that are simultaneously shuttered to provide the blooming protection. In one aspect, as has been described, the shutter can be applied across 2, 3, 4, 5, or more directly adjacent rows. In another aspect, the shutter can be applied across 2, 3, 4, 5, or more rows that are not directly adjacent, or that contain directly adjacent rows and non-directly adjacent rows in the same shutter. For example, a 4 row shutter can be applied to rows 10, 11, 12, and 13, or a 4 row shutter can be applied to rows 10, 12, 14, and 16, or to rows 10, 13, 14, and 17, or any other combination that facilitates blooming protection.

As has been described, the chance of blooming can vary depending on the relative charge between the source of the blooming and the affected rows, the pixel size, the epitaxial layer thickness, etc. As such, the shutter configurations can be designed to account for such factors. In one aspect, the present technology can utilized epitaxial layer thicknesses of from about 1 to about 10 microns, and can have pixel sizes of from about 0.9 microns to about 30 microns, or from about 0.9 microns to about 6 microns, or from about 0.9 microns to about 3 microns, to name a few non-limiting examples. As the size of the pixel is decreased, an increase in the number of rows shuttered to prevent or reduce blooming may need to be increased. For example, in a 0.9 micron pixel, the shutter can be up to 30 rows or more in some cases. It is, however, within the skill of those in the art to readily calculate the necessary shutter durations to account for these variations, once in possession of the present disclosure.

Furthermore, various shutter behaviors are contemplated, and can vary depending on the design and/or complexity of the device. In one aspect, a device can have a fixed shutter scheme. For example, a shutter may be fixed at a 4 row width in a device no matter what the imaging conditions. In another aspect, the shutter in a device can be manually set by a user for a given image or image conditions. In other aspects, the device can include an automatic mode, where the shutter characteristics are automatically set to match lighting conditions. Additionally, hybrid approaches are contemplated whereby a user sets the device to behave in a desired manner, and the device automatically sets or varies the shutter characteristics to optimal or near optimal conditions within the parameters set by the user.

The shutter can additionally be varied within a given frame or image process. For example, in one aspect the device can increase the duration of the shutter between a long integration time process and a medium integration time process, but decrease the duration of the shutter between the medium integration time process and a shorter integration time process. Thus, the duration of the shutter can be increased during HDR image capture in between the image sections that may have blooming issues, but decreased in between image sections that are not as likely to experience blooming. While in some devices such a behavior may be fixed, in other aspects the device can contain logic to dynamically increase the shutter duration or to apply a given shutter pattern when blooming is detected or when a scene is detected where blooming may occur. So, the logic can dynamically adjust the shutter in between integration time images, or in some aspects during a given rolling shutter operation for a given integration time. If an image is being read out for a longer integration time and a potential for blooming is detected, for example, the logic can adjust the shutter to limit or preclude blooming from occurring.

Additionally, in some aspects the strength (i.e., the voltages applied) of the reset can be constant throughout the duration of a given shutter, while in other aspects the shutter strength can be variable. For example, one energy saving technique may be to hard reset a row as the shutter is applied, lower the reset voltage during the middle of the shutter, and hard reset the row again just prior to the initiation of the next integration cycle. Variations in the shutter strength can be fixed in the device, set by the user, and/or dynamically controlled by the device. In the dynamically controlled case, the logic of the device can be utilized to detect blooming or the potential for blooming, and can thus increase the strength of the reset during such blooming periods and decrease the strength when blooming potential is lower.

Figure 2:
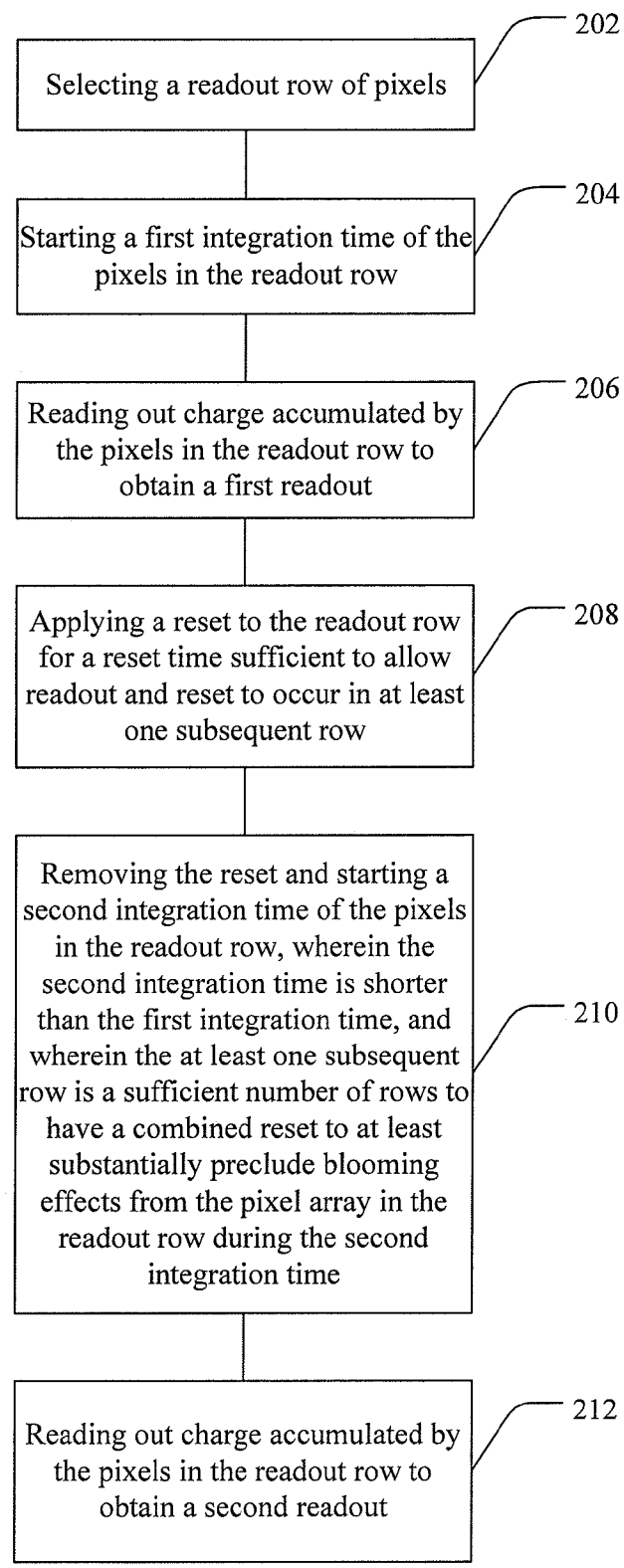
FIG. 2 is a depiction of a method of providing blooming protection in accordance with another aspect of the present disclosure.

As is shown in FIG. 2, one exemplary method provides blooming to a CMOS imager having a pixel array of a plurality of pixels arranged in rows and columns, where the CMOS imager is operable to capture high dynamic range images using a rolling shutter. The method can include 202 selecting a readout row of pixels, 204 starting a first integration time of the pixels in the readout row, and 206 reading out charge accumulated by the pixels in the readout row to obtain a first readout. The method also includes 208 applying a reset to the readout row for a reset time sufficient to allow readout and reset to occur in at least one subsequent row, 210 removing the reset and starting a second integration time of the pixels in the readout row, wherein the second integration time is shorter than the first integration time, and wherein the at least one subsequent row is a sufficient number of rows to have a combined reset to at least substantially preclude blooming effects from the pixel array in the readout row during the second integration time, and 212 reading out charge accumulated by the pixels in the readout row to obtain a second readout. It is noted that a subsequent row is a row that is read out or otherwise processed following the readout row. As such, applying a reset to the readout row for a reset time sufficient to allow readout and reset to occur in at least one subsequent row includes allowing the reset to continue on the reset row to at least give sufficient time for at least one subsequent row to be read out and reset. Thus, by allowing the reset of the readout row to be maintained for sufficient time to read out and reset two subsequent rows, a three row shutter has been implemented. Accordingly, in one aspect the reset can be applied for the reset time sufficient such that at least two subsequent rows and the readout row are simultaneously reset or in a reset state. In another aspect, the reset can be applied for the reset time sufficient such that at least three subsequent rows and the readout row are simultaneously reset or are in a reset state.

While it is convenient to describe reset and integration times in terms of row timing, it can also be useful to describe actual timing ranges. For example, in one aspect the reset time sufficient to allow readout and reset to occur in at least one subsequent row can be from about 10 nanoseconds to about 50 microseconds. In another aspect, the reset time sufficient to allow readout and reset to occur in at least one subsequent row can be from about 0.5 microseconds to about 2 microseconds. Understandably, these reset times can vary depending on the duration of the integration and the degree of potential blooming in the array. In another aspect, the first integration time can be from about 1 millisecond to about 1 second and the second integration time can be from about 10 nanoseconds to about 100 milliseconds. In yet another aspect, the first integration time can be from about 20 microseconds to about 33 milliseconds and the second integration time can be from about 1 microsecond to about 16 milliseconds.

As has been described, the present scope should also include shuttering or reset schemes that are sequential, non-sequential, adjacent, and non-adjacent. For example, in one specific aspect, the readout row and the at least three subsequent rows can be sequentially adjacent. In another aspect, the readout row and the at least three subsequent rows can be sequentially non-adjacent. The same would thus also apply to any number of subsequent rows greater than one (i.e., greater than two rows, the readout row and the at least one subsequent row).

Additionally, the method can be repeated for subsequent rows. In one aspect, for example, the method can be repeated on at least one subsequent row, at least two subsequent rows, at least three subsequent rows, and so on. In some aspects the at least one subsequent row is at least substantially all pixel rows in the pixel array. Furthermore, depending on the design of the device, the rows can be read out in various orders. For example, the method can be repeated on at least substantially all pixel rows in the pixel array in a sequential order. Such orders can include directly adjacent rows as a sequence, alternating rows as a sequence, and the like. Alternatively, the method can be repeated on at least substantially all pixel rows in the pixel array in a non-sequential order.

In addition to a first and second integration time, it is additionally contemplated that the present technology encompasses a third, fourth, or more integration times utilized to produce an HDR image. As such, in one aspect the method can further include applying the reset to the readout row following the second readout for a reset time sufficient to allow readout and reset to occur in at least one subsequent row, removing the reset and starting a third integration time of the pixels in the readout row, wherein the third integration time is shorter than the second integration time, and wherein the at least one subsequent row is a sufficient number of rows to have a combined reset to at least substantially preclude blooming effects from the pixel array in the readout row during the third integration time, and reading out charge accumulated by the pixels in the readout row to obtain a third readout. Similar steps can be accomplished for a fourth or more integration time.

It should be understood, however, that the terms "first," "second," "third," etc., should not be construed as meaning the first integration, second integration, and so on of a HDR image taken, but rather are intended to merely describe an order of execution of the integration times. Thus, in the method described above, for example, the terms "first" and "second" are merely describing two integration times that are temporally timed in the order of first and second. So in a HDR imaging process, the first integration time and the second integration time may represent the first and second integrations of the image, or they may represent the third and fourth, or the second and third, or any other pair of integration operations to which blooming protection applies. Thus, in cases where the first integration time corresponds to the first integration of a HDR image, starting the first integration time can include specifically applying the reset to the readout row and releasing the reset from the readout row. In cases where the first integration time described in the method does not correspond to the first integration of the HDR image, integration can be initiated by the readout and reset of the readout row from the previous integration.

As has been described, in one aspect the method can also include applying the reset at a continuous voltage level throughout the reset time duration. In another aspect, the reset can be applied at a variable voltage level throughout the reset time duration. Furthermore, in describing a multiple row shutter reset, it should be understood that for each subsequent readout and reset the reset voltage on each row of the shutter can be maintained or the reset voltage can be reapplied for each processing cycle. As a non-limiting example, for a shutter across rows five, six, seven, and eight, as row nine is read out the shutter moves to rows six, seven, eight, and nine, and is released from row five to begin integration of the next image part. In such a case, the reset can be maintained on rows six, seven, eight, and then applied to nine, or the reset can be reapplied to rows six, seven, eight, and then applied to nine. It is thus non-limiting as to how the shutter is applied and/or maintained, provided sufficient shutter is in place to prevent or limit blooming from corrupting across the shutter.

The method can additionally further include, in some aspects, the formation of a HDR image from the individual images derived from the different integrations, in some cases at different integration times. For example, in one aspect the first readout and the second readout can be combined to form a high dynamic range image. Thus, at a row level, the various integration times for each row can be combined to form the resulting image. At the image level, the row data from the various integration times can be formed into discrete images or image data sets and then the images or image data sets from each integration can be combined to form the HDR image. Thus, two integration images, three integration images, four integration images or more can be combined into the HDR image. In some cases, all integration images are combined, while in other cases only a subset of integration images are combined.

Figure 3:
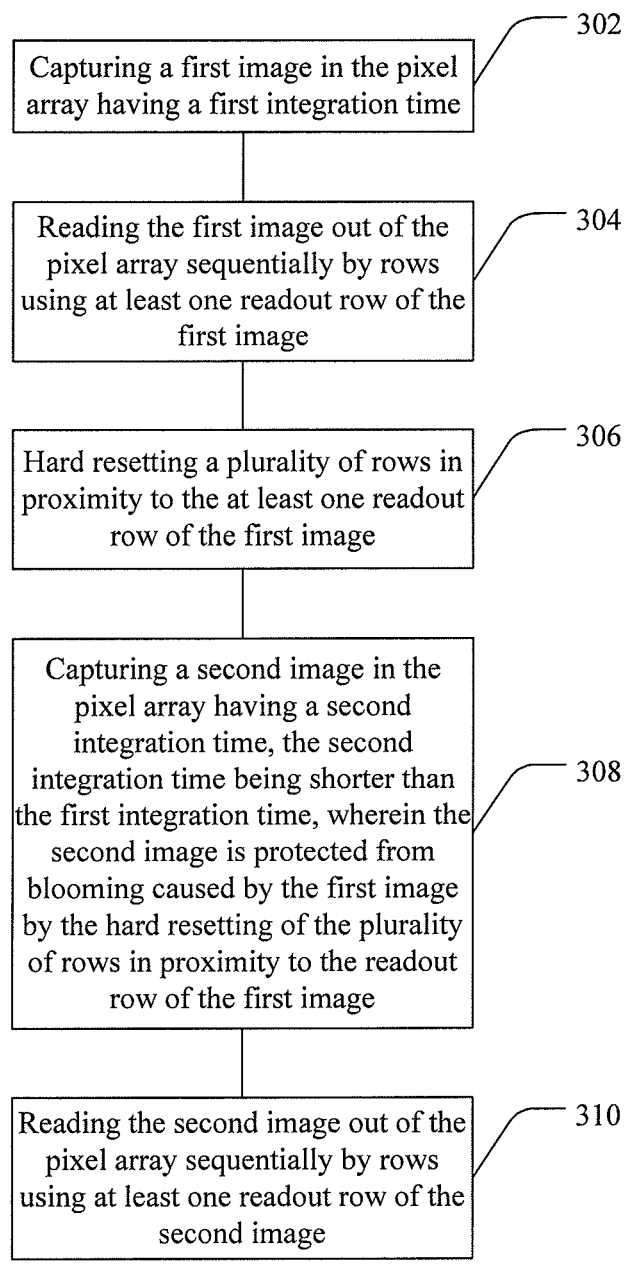
FIG. 3 is a depiction of a method of providing blooming protection in accordance with another aspect of the present disclosure.

In another aspect of the present disclosure, as is shown in FIG. 3, a method of using a rolling shutter to provide blooming protection in a CMOS imager in high dynamic range mode and having a pixel array of a plurality of pixels arranged in rows and columns is provided. Such a method can include 302 capturing a first image in the pixel array having a first integration time, 304 reading the first image out of the pixel array sequentially by rows using at least one readout row of the first image, and 306 hard resetting a plurality of rows in proximity to the at least one readout row of the first image. The method also includes 308 capturing a second image in the pixel array having a second integration time, the second integration time being shorter than the first integration time, wherein the second image is protected from blooming caused by the first image by the hard resetting of the plurality of rows in proximity to the readout row of the first image, and 310 reading the second image out of the pixel array sequentially by rows using at least one readout row of the second image.

As with the previous method aspects, the present method is not limited to two images, nor should the terms "first" and "second" be construed as necessarily the first and second images taken, but rather describe an order the images are captured. As such, in some aspects the method can further include hard resetting a plurality of rows in proximity to the at least one readout row of the second image, capturing a third image in the pixel array having a third integration time, the third integration time being shorter than the second integration time, wherein the third image is protected from blooming caused by the first or the second image by the hard resetting of the plurality of rows in proximity to the readout row of the second image, and reading the third image out of the pixel array sequentially by rows using at least one readout row of the third image. In yet other aspects similar processing can be utilized to generate a fourth, fifth, sixth, or more images for HDR purposes.

Additionally, in some aspects the first image and the second image can be combined to form a HDR image. In other aspects, the first image, the second image, and the third image can be combined to form a HDR image. Thus, any number of images taken can be combined, either all together or a particular subset thereof, to form a HDR image.

The following is a more detailed description of the CMOS processing, components, and methodologies that may be useful in the practice and/or implementation of the present technology. It should be understood that wide variations in devices, device architectures, device design, and method implementation are contemplated that may depend, at least in part, on the particular CMOS technology used, the desired HDR capabilities, the specific types of lighting scenes in which HDR is utilized, various design preferences, device cost, and the like. As such, the present scope should not be accordingly limited. It should also be understood that those skilled in the art can readily design and produce systems and devices incorporating the present technology once in possession of the present disclosure. In some cases, this technology can be implemented into current HDR imagers using minimal row driver digital design modifications.

Furthermore, it is also contemplated that other beneficial technologies can also be implemented to further improve the HDR imaging process. One example of such a technology that can be utilized during a readout process is correlated double sampling (CDS). CDS is a technique for measuring a signal that allows for removal of an undesired offset and low frequency temporal noise (e.g. kTC noise for CMOS pixel). The output signal is thus measured twice: once in a known condition and once in an unknown condition. The value measured from the known condition is then subtracted from the unknown condition to generate a value with a known relation to the physical quantity being measured. In one aspect, a CDS operation can be performed on a row that is being read out from the imager.

Figure 6:
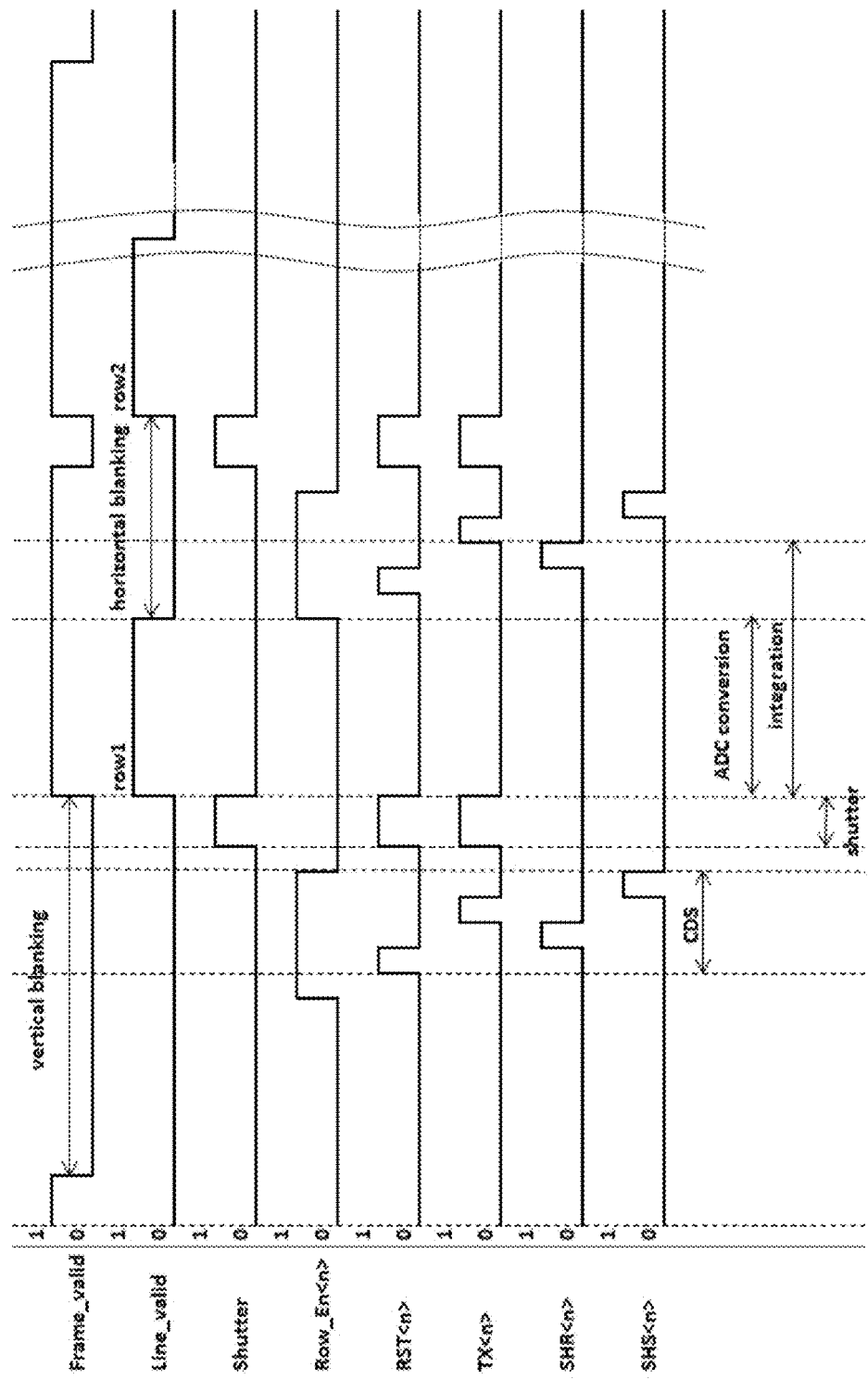
FIG. 6 is a graphical representation of a timing diagram for a rolling shutter readout scheme, in accordance with another aspect of the present disclosure.

In one example of a rolling shutter readout operation is shown, as a timing diagram, in FIG. 6. In this example, the integration time is 1 row. To read out the signal, the floating diffusion (FD) is reset with the reset signal (RST), and the signal from the FD will be sampled with the SHR signal. Next, TX will activate for charge transfer, and the signal will then be sampled with the SHS pulse. The difference between the SHR and SHS signals will be used for the final signal, which will be CDS mode. Following CDS, a shutter operation can be performed in which both RST and TX will be pulsed for the shutter row, or rows in some cases. This readout operation can then be repeated for other rows in the array.

As another example, a CDS operation can include setting the reset select transistor of the row being read to a high state and setting the power supply to a high power supply setting to set the floating diffusion regions to the high power supply setting in the row being read. As a non-limiting example, the power supply can be increased from 2.8 V to a high power supply setting of 3.1 V. The electrical charge in the floating diffusion regions can then be read to obtain a first electrical charge value. The transfer transistor of the row being read can then be set to a high state to transfer electrical charge in the photodiode to the floating diffusion regions of the row being read. Subsequently, the electrical charge in the floating diffusion regions can be read to obtain a second electrical charge value. The second charge value can then be subtracted from the first electrical charge value to obtain the CDS sampled output.

The following equations and techniques represent various methodologies to provide blooming protection using a rolling shutter in HDR imaging. Such are meant to be exemplary, and should not be seen as limiting. As such, various mathematical equations can be utilized in the understanding of the overall anti-blooming process, and such may be useful in the practice of the present technology.

In rolling shutter mode, a CMOS pixel array is read out essentially a row at a time, although in some aspects more than one row may be read out simultaneously or in an overlapping fashion. In the following equations, $r_c$ represents the readout row, or in other words, the pointer to the readout row. The readout can be accomplished by any readout technique. As has been described above, one beneficial readout technique is CDS mode readout, which allows for removal of an undesired offset and/or temporal noise associated with reset of floating diffusion (FD). CDS readout mode can be signified in the following equations by the term $r_{CDS}$, which represents the readout row being read out in CDS mode. Thus in the case of $r_{CDS}^1$, as is shown in Equation (1), the physical row index is set to row 1 which is being read out, and the readout data has a CDS operation is applied to it.

$$r_c = r_{CDS}^1 \quad (1)$$

The term "shutter" refers to a shutter operation or a resetting operation of the pixels. As such, the terms "shutter" and "reset" can be used interchangeably, unless the context clearly indicates otherwise. A reset can thus occur in a selected pixel or pixel row or rows to produce a "reset state," or in other words a state in which the pixel is not in a charge accumulation or integration state. Thus a reset state is a state in which the pixel is not accumulating charge for the purpose of readout for imaging. In general, the reset is a reset voltage that is applied to the pixel to remove accumulated charge and to prevent or reduce further accumulation. It is additionally contemplated that the reset voltage can be applied and/or maintained at different levels, depending on the voltage applied and/or maintained in the pixel. So, for example, a complete reset can be applied to the pixel to at least substantially erase the accumulated charge and, if maintained in the pixel, to prevent or significantly prevent further charge accumulation. This initial strong or sharp voltage application can be referred to herein as a "hard reset." In other cases, particularly for power saving operations, a lower voltage can be applied to and/or maintained in the pixel if desired. It is noted that in some cases a pixel can accumulate charge when in a reset state; however such charge accumulation is not a purposeful charge accumulation for readout of an image.

Accordingly, when a shutter is removed from a pixel, the pixel can begin accumulating charge from incoming photons. From the beginning of such charge accumulation to the readout of the pixel is generally referred to as the integration time of the pixel. Thus, in a rolling shutter mode, a shutter or reset voltage can be applied to a row of pixel to place the row in a reset state. When the reset voltage is removed, the row of pixels can then begin accumulating charge from incoming light and is thus in an integration state. For the purposes of the present disclosure, $r_{shutter}^i$ is used to refer to the physical row index of a pixel row that is being shuttered for the $i_{th}$ pointer operation. Also, $t_{int}^1$ refers to the first pointer's integration time in units of row(s) and "$t_{int}^i$" refers to $i_{th}$ pointer's integration time in units of row(s). For example, a given row is reset and allowed to integrate charge over a given integration time. Thus the readout row $r_c$ is shuttered or reset and read out following an integration time in numbers of rows ($t_{int}^i$), as is described by Equation (2):

$$r_{shutter}^i = r_c + t_{int}^i \quad (2)$$

In some aspects in rolling shutter mode, as a physical row $r_c$ is being read out, row $r_c + r_{shutter}$ can be hard reset, where $r_{shutter}$ is at least one row, but can also include multiple rows in the imager array.

As has been described, blooming protection can be provided to HDR capture through the strategic use of a shutter in between at least two of the images used in the HDR imaging process. Such blooming protection thus effectively minimizes or prevents the crossover or blooming of charge from one region of the array to another. In the following equations, the term "p" is used to describe the blooming protection row count (or purge row count) in numbers of rows that is provided by this strategic shutter. It is noted that the rows may or may not be sequential, that various numbers of rows or patterns of rows can be used as blooming protection, and that such variations are intended to be within the present scope. Those of ordinary skill in the art would recognize appropriate variations in the equations and methodologies disclosed herein to account for such variations in design. In one aspect, however, p can be greater than one row, or more. Any number of rows or patterns of rows that can reduce or eliminate blooming are contemplated and included in the present scope.

As is shown in Equation (3), a shutter is applied to a row or rows of the array to provide protection from blooming.

$$r_{CDS}^1 = r_{CDS}^{i-1} - t_{int}^i - p \text{ (for } i > 1) \quad (3)$$

While the terms of this equation indicate that the row is read out in CDS mode, it is also to be understood that any readout mode is additionally contemplated, and that CDS terminology is used merely for convenience. The same is true for the other equations shown herein.

Accordingly, a larger-than-1-row purge row count can enable the HDR imager device to have reduced blooming effects. This blooming purge count p provides additional shifts between different pointer operation regarding readout and shutter row index. The shift can be adjusted to achieve the proper anti-blooming properties given a particular scene. In Equation (4), the total shutter count of p times is allowed, and in this case provides the blooming protection. In one aspect, for example on a CMOS imager design, a (p+1) shutter can be executed sequentially after a readout such as CDS.

$$r_{shutter}^i = r_{CDS}^{i-1} - p, (r_{shutter}^{i-1} = r_{CDS}^{i-1} - p+1, \ldots, \\ r_{shutter}^{i-p-1} = r_{CDS}^{i-1})(\text{for } i>1, p \geq 0) \quad (4)$$

As one example, FIG. 4 graphically shows an exemplary embodiment having a first and second pointer row-wise HDR CMOS image sensor timing scheme without any blooming protection (e.g. p=0). In this timing scheme $t_{int}^1=100$ rows and $t_{int}^2=3$ rows. In this aspect it is assumed that the valid row address starts at row 1 and will end at row N. As such, the physical row readout for the first pointer will start on row 1 (CDS:1). Since the first integration time is 100 row units, row 101 is shuttered (S: 101) as row 1 is read out. It is noted in the timing scheme another row (CDS: −2) is also read out. Since the physical row −2 is non-existent no row data will be readout. Once read out, row 1 is shuttered (S:1) in preparation for the second integration.

In the next time frame, the 2" physical row (CDS: 2) is read out in CDS mode. Since the integration time is 100 rows, row 102 is shuttered (S:102) and row 101 begins integration. Row 2 is shuttered (S:2) in preparation for the second integration of row 2, and the shutter is removed from row 1, which begins the second integration ($t_{int}^2$). Because the shutter is only one row wide, blooming can cross into the second integration time.

Figure 5:
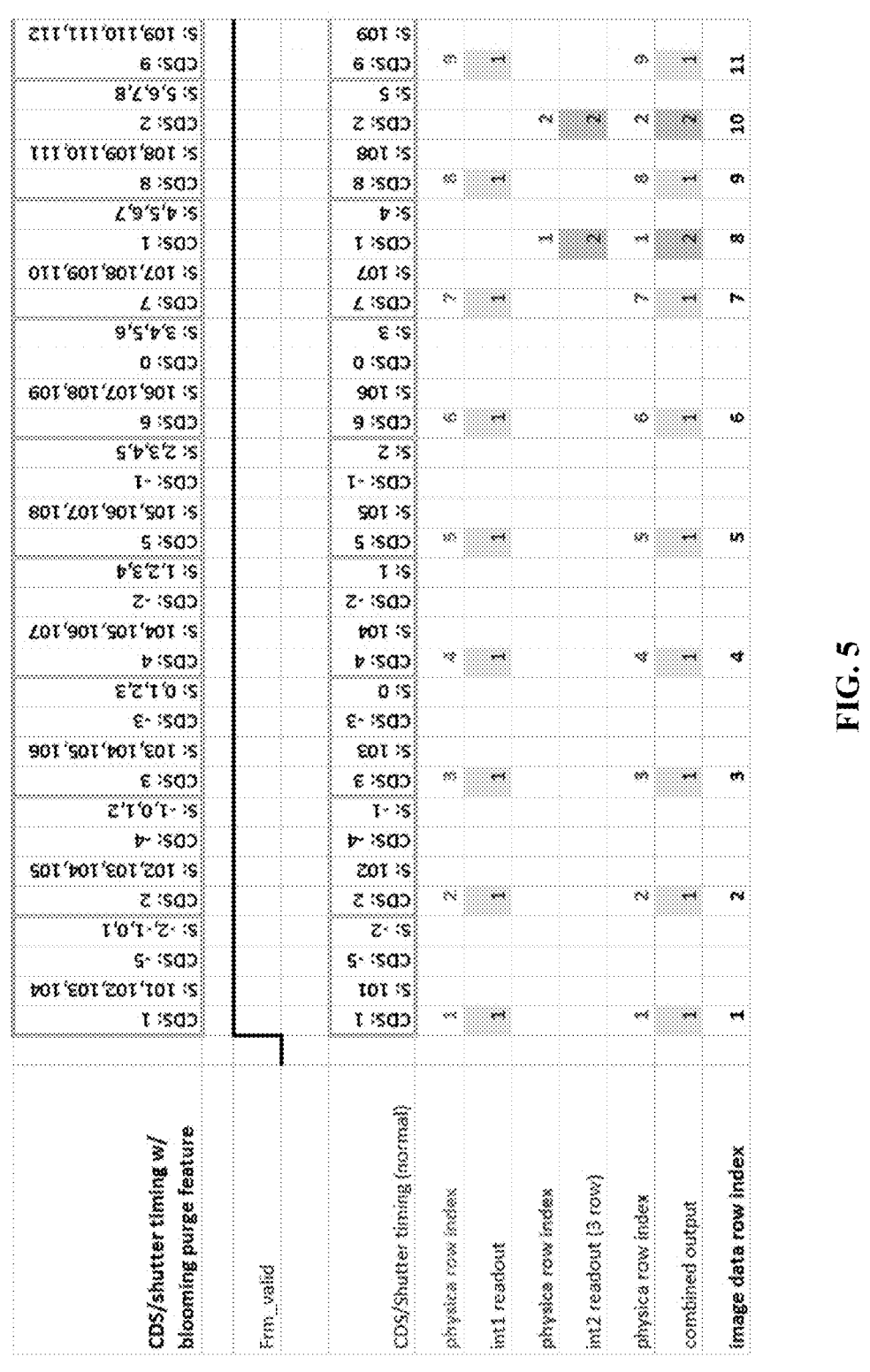

A similar timing scheme to FIG. 4 is shown in FIG. 5, but having blooming protection or blooming purge count of 3 rows (p=3). For this example, the integration times remain at $t_{int}^1$=100 row, $t_{int}^2$=3 row. It is noted that these integration times are merely exemplary, and any desired integration time can be used, in some cases depending on light intensity. The readout sequence for the first integration or the $1^{st}$ pointer for row 1 is: CDS: 1; Shutter: 101, CDS: −5; Shutter: −2, −1, 0, 1. Since physical row index starts at 1, the CDS of row −5 will not produce any data since −5 is not a valid physical row address. For the $2^{nd}$ pointer shutter operation, a total of 4 rows are being reset: −2, −1, 0, 1. If row 7 is read out for the $1^{st}$ pointer, its CDS and shutter sequence will be derived by setting p=3 for Equations (1)-(4), for example. Thus, the resultant terms will be CDS: 7; Shutter: 107, 108, 109, 110; CDS: 1, Shutter: 4, 5, 6, 7. For the $2^{nd}$ pointer shutter operation, a total of 4 rows are being reset sequentially: 4, 5, 6, and 7. Among those 4 sequential shutter operations, the $1^{st}$ one (for row 4) is used to start integration of row 4 for the $2^{nd}$ pointer. Additional bloom purge shutter 5, 6, 7 are used to provide blooming protection as has been described. If a high intensity light impinges on physical rows 5, 6, and 7, the intensity of the light spot can cause the pixel to reach saturation after 5 rows of integration time. Once rows 5, 6, and 7 are shuttered (reset), they change from a saturation state to an unsaturation state. For the same light intensity as used in the example of FIG. 4, rows 5, 6, and 7 will not reach saturation and blooming during row 4's integration for $2^{nd}$ pointer or second integration time. Thus, the integration for row 4 will not be corrupted by blooming. Since the blooming purge count is set to 3 (p=3), the additional sequential shutter count is not more than 3. For example, sequential shutters can include 4, 5, or 4, 5, 6 in this case. Notably, depending on the scene, additional blooming purge shutters can provide better blooming protection. However, one caveat of using longer shutter durations can be, in some cases, a negative impact on frame rate depending on the imager readout architecture and how the shutter operation is applied. If the shutter operation is applied in parallel during ADC conversion and data readout, additional blooming purge shutter may not affect the frame rate. Since every row will be reset multiple times on average, signal levels of extremely hot pixels will also be reduced by the additional bloom purge shutters.

It is noted that in CMOS imager design, a register can be used for additional bloom purge shutter count. The value of this blooming purge count can be controlled by the user directly or other by image processing algorithms that detect blooming issues on the image. The row driver control logic can also be designed based on Equations (1)-(4) as shown above.

Furthermore, in one aspect the additional bloom purge shutter can be applied sequentially to each pointer's shutter operation. However, the application of the additional bloom purge shutter should apply only to a particular pointer operation. This can be beneficial if the additional blooming purge shutter has a negative impact on frame rate. For example, for a 2-pointer row-wise HDR image sensor, if $t_{int}^1$=100 row, and $t_{int}^2$=3 row, adding additional bloom purge shutter for the $1^{st}$ pointer operation might not be necessary since the integration time is already 100 rows. The additional purge shutter can be applied to the $2^{nd}$ pointer in order to correctly expose the brighter portions of a scene. For a 3-pointer row-wise HDR image sensor, for example, if $t_{int}^1$=100 rows, the $t_{int}^2$=20 rows and $t_{int}^3$=2 rows, and an intense light spot saturates the pixels with a 5 row integration time, the additional blooming purge shutter count of 3 can be applied only to the $3^{rd}$ pointer shutter operation.

As examples, 3-pointer row-wise image sensor readout and shutter algorithms for a third integration time are shown in Equations (5)-(10). Similar equations can readily be derived therefrom for fourth, fifth, and greater integration times.

$$r_{CDS}^1 = r^j \tag{5}$$

$$r_{shutter}^1 = r^j + t_{int}^1 \tag{6}$$

$$r_{CDS}^2 = r^j - t_{int}^2 - 1 \cdot p \tag{7}$$

$$r_{shutter}^2 = r^j - p, r_{shutter}^{2-1} = r^j - p + 1, \ldots, r_{shutter}^{2\_p-1} = r^j \tag{8}$$

$$r_{CDS}^3 = r^j - t_{int}^2 - t_{int}^3 - 2 \cdot p \tag{9}$$

$$r_{shutter}^3 = r^j - t_{int}^2 - 2 \cdot p, r_{shutter}^{3\_1} = r^j - t_{int}^2 - 2 \cdot p + 1, \ldots, r_{shutter}^{3\_p-1} = r^j - t_{int}^2 - p \tag{10}$$

As another example and moving to the timing scheme where row 4 is read out for the $1^{st}$ pointer, using the equations above, the CDS and shutter sequence can be calculated by setting p=0. The resultant parameters are the following: (CDS: 4; Shutter: 104; CDS: 1; Shutter: 4). The raw data from row 4 is read out; then a shutter is applied to rows 104, 105, 106, and 107; data from row 1 is read out, noting that the data readout of row 1 is after a 3 row integration time; and subsequently a shutter operation is applied to rows 4, 5, 6 and 7. It should be pointed out that row 4 will not be read out again until row 7 is read out. Equations (1)-(4) can be applied to the above example as follows; after row 4 is read out for first pointer operation, shutter is applied to row 104 (i.e. $r_c(4)+t_{int}^1(100)$) for first point operation. Subsequently, row 1 is readout for $2^{nd}$ pointer operation and a shutter is applied to row 4 (i.e. $r_{shutter}^2 = r_{CDS}^1 - p = 4 - 0 = 4$) for the $2^{nd}$ pointer operation. Since row 1 is a valid row address, its data will be output from the imager. It should be noted that, after readout of row 4 for the $1^{st}$ pointer, the image data will be in a row-wise interlaced pattern in which an odd row will be associated with one integration time and even rows will be associated with a different integration time. After the above operation, row 4 starts integration for its second integration time. If a high intensity light spot is being integrated by rows 5, 6, and 7, the intensity of this light spot and can cause the pixel to reach saturation after about five (5) rows of integration time. Since rows 5, 6, and 7 are still in their first pointer operation (which has integration time of 100 rows), all those rows are saturated (since those rows previously integrated 99, 98, 97 rows already for physical rows 5, 6, 7, respectively) and start blooming into their neighboring rows. Therefore, the integrated signal of row 4 for the $2^{nd}$ pointer will likely be corrupted from blooming from row 5, 6, and 7 (depending on the pixel size and doping conditions). Notably, pixels of the present technology can bloom into neighboring rows since row 5, 6, and 7 are not idle even if the image sensor is running a true "anti-blooming" timing. In a typical so-called "anti-blooming" timing, an idle row's reset (RST) and transfer (TX) gate are set to high and remain high during the entire idle period to provide blooming protection. An idle row refers to a physical row in the sensor array that is not in integration or in shutter operation. Additionally, idle rows could include all those rows that are outside the addressed image output windows. For example, in a sensor array with 100 rows, and the image output window is the center 50 rows, then the top 25 rows and the bottom 25 rows can be considered in an idle row operation or mode. To implement "anti-blooming" timing, a latch-based row decoder design is typically required. Therefore, an image sensor running such "anti-blooming" timing cannot protect the rows in a second pointer from blooming corruption.

Various benefits of the present technology include the reduction in die size due to not needing a latch-based row driver, flexible to handle 2-pointer, 3-pointer, or more pointer row-wise HDR operation, the reduction in hot pixel impact on final images since the pixels will reset multiple times in average, among other things.

The present scope additionally includes systems and devices utilizing the present technology. Such should include any CMOS device, system, architecture, and/or design that allows HDR imaging using a rolling shutter. As has been described, those skilled in the art can readily design and produce systems and devices incorporating the present technology once in possession of the present disclosure. In some cases, this technology can be implemented into current HDR imagers using minimal row driver digital design modifications.

The following are exemplary of various aspects of the present disclosure. In example 1, a method of providing blooming protection to a CMOS imager having a pixel array of a plurality of pixels arranged in rows and columns, where the CMOS imager is operable to capture high dynamic range images using a rolling shutter, is provided. Such a method can include selecting a readout row of pixels, starting a first integration time of the pixels in the readout row, reading out charge accumulated by the pixels in the readout row to obtain a first readout, applying a reset to the readout row for a reset time sufficient to allow readout and reset to occur in at least one subsequent row, removing the reset and starting a second integration time of the pixels in the readout row, wherein the second integration time is shorter than the first integration time, and wherein the at least one subsequent row is a sufficient number of rows to have a combined reset to at least substantially preclude blooming effects from the pixel array in the readout row during the second integration time, and reading out charge accumulated by the pixels in the readout row to obtain a second readout.

In another example, the method of example 1 can be repeated on at least one subsequent row.

In another example, the at least one subsequent row is at least substantially all pixel rows in the pixel array.

In another example, the method of example 1 can be repeated on at least substantially all pixel rows in a sequential order.

In another example, the method of example 1 can be repeated on at least substantially all pixel rows in a non-sequential order.

In another example, the first readout and the second readout are combined to form a high dynamic range image.

In another example, the method of example 1 can further include applying the reset to the readout row following the second readout for a reset time sufficient to allow readout and reset to occur in at least one subsequent row, removing the reset and starting a third integration time of the pixels in the readout row, wherein the third integration time is shorter than the second integration time, and wherein the at least one subsequent row is a sufficient number of rows to have a combined reset to at least substantially preclude blooming effects from the pixel array in the readout row during the third integration time, and reading out charge accumulated by the pixels in the readout row to obtain a third readout.

In another example, the method can be repeated for a fourth or more integration time.

In another example, starting the first integration time further includes applying the reset to the readout row and releasing the reset from the readout row.

In another example, applying the reset to the readout row for the reset time sufficient to allow readout and reset to occur in at least one subsequent row includes applying the reset at a continuous voltage level throughout the reset time duration.

In another example, applying the reset to the readout row for the reset time sufficient to allow readout and reset to occur in at least one subsequent row includes applying the reset at a variable voltage level throughout the reset time duration.

In another example, the reset is applied for the reset time sufficient such that at least two subsequent rows and the readout row are simultaneously reset.

In another example, the reset is applied for the reset time sufficient such that at least three subsequent rows and the readout row are simultaneously reset.

In another example, the readout row and the at least three subsequent rows are sequentially adjacent.

In another example, the readout row and the at least three subsequent rows are sequentially non-adjacent.

In another example, the reset time sufficient to allow readout and reset to occur in at least one subsequent row is from about 10 nanoseconds to about 50 microseconds.

In another example, the first integration time is from about 1 millisecond to about 1 second and the second integration time is from about 10 nanoseconds to about 100 milliseconds.

In another example, a method of using a rolling shutter to provide blooming protection in a CMOS imager in high dynamic range mode and having a pixel array of a plurality of pixels arranged in rows and columns can include capturing a first image in the pixel array having a first integration time, reading the first image out of the pixel array sequentially by rows using at least one readout row of the first image, hard resetting a plurality of rows in proximity to the at least one readout row of the first image, capturing a second image in the pixel array having a second integration time, the second integration time being shorter than the first integration time, wherein the second image is protected from blooming caused by the first image by the hard resetting of the plurality of rows in proximity to the readout row of the first image, and reading the second image out of the pixel array sequentially by rows using at least one readout row of the second image.

In another example, the first image and the second image are combined to form a high dynamic range image.

In another example, the method can further include hard resetting a plurality of rows in proximity to the at least one readout row of the second image, capturing a third image in the pixel array having a third integration time, the third integration time being shorter than the second integration time, wherein the third image is protected from blooming caused by the first or the second image by the hard resetting of the plurality of rows in proximity to the readout row of the second image, and reading the third image out of the pixel array sequentially by rows using at least one readout row of the third image.

In another example, the first image, the second image, and the third image are combined to form a high dynamic range image.

Of course, it is to be understood that the above-described arrangements are only illustrative of the application of the principles of the present disclosure. Numerous modifications and alternative arrangements may be devised by those skilled in the art without departing from the spirit and scope of the present disclosure and the appended claims are intended to cover such modifications and arrangements. Thus, while the present disclosure has been described above with particularity and detail in connection with what is presently deemed to be the most practical embodiments of the disclosure, it will be apparent to those of ordinary skill in the art that numerous modifications, including, but not limited to, variations in size, materials, shape, form, function and manner of operation, assembly and use may be made without departing from the principles and concepts set forth herein.

What is claimed is:

1. A method of providing blooming protection to a CMOS imager having a pixel array of a plurality of pixels arranged in rows and columns, where the CMOS imager is operable to capture high dynamic range images using a rolling shutter, comprising:
   selecting a readout row of pixels;
   starting a first integration time of the pixels in the readout row;
   reading out charge accumulated by the pixels in the readout row to obtain a first readout;
   applying a reset to the readout row for a reset time sufficient to allow readout and reset to occur in at least three subsequent rows, wherein the reset is applied for the reset time sufficient such that the at least three subsequent rows and the readout row are simultaneously reset;
   removing the reset and starting a second integration time of the pixels in the readout row, wherein the second integration time is shorter than the first integration time, and wherein the at least one subsequent row is a sufficient number of rows to have a combined reset to at least substantially preclude blooming effects from the pixel array in the readout row during the second integration time; and
   reading out charge accumulated by the pixels in the readout row to obtain a second readout.

2. The method of claim 1, further comprising repeating the method of claim 1 on at least one subsequent row.

3. The method of claim 2, wherein the at least one subsequent row is at least substantially all pixel rows in the pixel array.

4. The method of claim 3, wherein the method is repeated on at least substantially all pixel rows in a sequential order.

5. The method of claim 3, wherein the method is repeated on at least substantially all pixel rows in a non-sequential order.

6. The method of claim 1, wherein the first readout and the second readout are combined to form a high dynamic range image.

7. The method of claim 1, further comprising:
   applying the reset to the readout row following the second readout for a reset time sufficient to allow readout and reset to occur in at least one subsequent row;
   removing the reset and starting a third integration time of the pixels in the readout row, wherein the third integration time is shorter than the second integration time, and wherein the at least one subsequent row is a sufficient number of rows to have a combined reset to at least substantially preclude blooming effects from the pixel array in the readout row during the third integration time; and
   reading out charge accumulated by the pixels in the readout row to obtain a third readout.

8. The method of claim 7, repeated for a fourth or more integration time.

9. The method of claim 1, wherein starting the first integration time further includes applying the reset to the readout row and releasing the reset from the readout row.

10. The method of claim 1, wherein applying the reset to the readout row for the reset time sufficient to allow readout and reset to occur in at least one subsequent row includes applying the reset at a continuous voltage level throughout the reset time duration.

11. The method of claim 1, wherein applying the reset to the readout row for the reset time sufficient to allow readout and reset to occur in at least three subsequent rows includes applying the reset at a variable voltage level throughout the reset time duration.

12. The method of claim 1, wherein the readout row and the at least three subsequent rows are sequentially adjacent.

13. The method of claim 1, wherein the readout row and the at least three subsequent rows are sequentially non-adjacent.

14. The method of claim 1, wherein the reset time sufficient to allow readout and reset to occur in at least three subsequent rows is from about 10 nanoseconds to about 50 microseconds.

15. The method of claim 1, wherein the first integration time is from about 1 millisecond to about 1 second and the second integration time is from about 10 nanoseconds to about 100 milliseconds.

16. A method of using a rolling shutter to provide blooming protection in a CMOS imager in high dynamic range mode and having a pixel array of a plurality of pixels arranged in rows and columns, comprising:
   capturing a first image in the pixel array having a first integration time;
   reading the first image out of the pixel array sequentially by rows using at least one readout row of the first image;
   hard resetting a plurality of rows in proximity to the at least one readout row of the first image;
   capturing a second image in the pixel array having a second integration time, the second integration time being shorter than the first integration time, wherein the second image is protected from blooming caused by the first image by the hard resetting of the plurality of rows in proximity to the readout row of the first image;
   reading the second image out of the pixel array sequentially by rows using at least one readout row of the second image;
   hard resetting a plurality of rows in proximity to the at least one readout row of the second image;
   capturing a third image in the pixel array having a third integration time, the third integration time being shorter than the second integration time, wherein the third image is protected from blooming caused by the first or the second image by the hard resetting of the plurality of rows in proximity to the readout row of the second image; and reading the third image out of the pixel array sequentially by rows using at least one readout row of the third image.

17. The method of claim 16, wherein the first image and the second image are combined to form a high dynamic range image.

18. The method of claim 16, wherein the first image, the second image, and the third image are combined to form a high dynamic range image.

19. A method of providing blooming protection to a CMOS imager having a pixel array of a plurality of pixels arranged in rows and columns, where the CMOS imager is operable to capture high dynamic range images using a rolling shutter, comprising:
  selecting a readout row of pixels;
  starting a first integration time of the pixels in the readout row;
  reading out charge accumulated by the pixels in the readout row to obtain a first readout;
  applying a reset to the readout row for a reset time sufficient to allow readout and reset to occur in at least one subsequent row;
  removing the reset and starting a second integration time of the pixels in the readout row, wherein the second integration time is shorter than the first integration time, and wherein the at least one subsequent row is a sufficient number of rows to have a combined reset to at least substantially preclude blooming effects from the pixel array in the readout row during the second integration time; and
  reading out charge accumulated by the pixels in the readout row to obtain a second readout;
  applying the reset to the readout row following the second readout for a reset time sufficient to allow readout and reset to occur in at least one subsequent row;
  removing the reset and starting a third integration time of the pixels in the readout row, wherein the third integration time is shorter than the second integration time, and wherein the at least one subsequent row is a sufficient number of rows to have a combined reset to at least substantially preclude blooming effects from the pixel array in the readout row during the third integration time; and
  reading out charge accumulated by the pixels in the readout row to obtain a third readout.

20. The method of claim 19, repeated for a fourth or more integration time.

21. A method of providing blooming protection to a CMOS imager having a pixel array of a plurality of pixels arranged in rows and columns, where the CMOS imager is operable to capture high dynamic range images using a rolling shutter, comprising:
  selecting a readout row of pixels;
  starting a first integration time of the pixels in the readout row;
  reading out charge accumulated by the pixels in the readout row to obtain a first readout;
  applying a reset to the readout row for a reset time sufficient to allow readout and reset to occur in at least one subsequent row, wherein the reset is applied at a variable voltage level throughout the reset time duration;
  removing the reset and starting a second integration time of the pixels in the readout row, wherein the second integration time is shorter than the first integration time, and wherein the at least one subsequent row is a sufficient number of rows to have a combined reset to at least substantially preclude blooming effects from the pixel array in the readout row during the second integration time; and
  reading out charge accumulated by the pixels in the readout row to obtain a second readout.

22. The method of claim 21, wherein the reset is applied for the reset time sufficient such that the at least two subsequent rows and the readout row are simultaneously reset.

23. The method of claim 19, wherein the reset is applied for the reset time sufficient such that the at least two subsequent rows and the readout row are simultaneously reset.

* * * * *